United States Patent
Tang et al.

(10) Patent No.: US 10,903,823 B2
(45) Date of Patent: Jan. 26, 2021

(54) OSCILLATION SIGNAL PRODUCTION

(71) Applicant: Qualcomm Incorporated, San Diego, CA (US)

(72) Inventors: Yiwu Tang, San Diego, CA (US); Sujiang Rong, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/147,685

(22) Filed: Sep. 29, 2018

(65) Prior Publication Data

US 2020/0106423 A1 Apr. 2, 2020

(51) Int. Cl.
*H03K 3/03* (2006.01)
*H03B 27/00* (2006.01)
*H03B 5/12* (2006.01)
*H03K 3/011* (2006.01)

(52) U.S. Cl.
CPC ......... *H03K 3/0315* (2013.01); *H03B 5/1212* (2013.01); *H03B 5/1228* (2013.01); *H03B 27/00* (2013.01); *H03K 3/011* (2013.01); *H03K 3/0322* (2013.01)

(58) Field of Classification Search
CPC .... H03B 27/00; H03K 3/0315; H03K 3/0322; H03L 7/24
USPC ......................................................... 331/57
See application file for complete search history.

(56) References Cited

U.S. PATENT DOCUMENTS

| | | | |
|---|---|---|---|
| 5,864,258 A | 1/1999 | Cusinato et al. | |
| 5,912,591 A * | 6/1999 | Yamada | H03K 3/0231 331/57 |
| 5,912,596 A * | 6/1999 | Ghoshal | H03K 3/0322 331/108 B |
| 5,959,504 A * | 9/1999 | Wang | H03K 3/354 331/115 |

(Continued)

FOREIGN PATENT DOCUMENTS

CN 102281061 A 12/2011

OTHER PUBLICATIONS

Li G., et al., "A Low-Phase-Noise Multi-Phase Oscillator Based on Left-Handed LC-Ring", IEEE Journal of Solid-State Circuits, Sep. 2010, vol. 45, No. 9, pp. 1822-1833.

(Continued)

*Primary Examiner* — Levi Gannon
(74) *Attorney, Agent, or Firm* — Qualcomm Incorporated

(57) ABSTRACT

An apparatus for radio-frequency (RF) oscillation signal production is disclosed. In example implementations, an apparatus includes an oscillator. The oscillator includes multiple oscillation stages that are coupled together in series into a ring. A respective oscillation stage of the multiple oscillation stages includes a transconductance amplifier and a core oscillator. The transconductance amplifier is coupled to a preceding oscillation stage. The core oscillator is coupled to the transconductance amplifier and to a succeeding oscillation stage, with the core oscillator including at least one output node configured to provide a respective output signal. In some implementations, at least one capacitor is coupled across at least the transconductance amplifier. In some aspects, at least one transistor of the transconductance amplifier is implemented with a silicon-on-insulator metal-oxide-semiconductor (SOI MOS) device that includes at least one back-gate terminal.

30 Claims, 12 Drawing Sheets

(56) References Cited

U.S. PATENT DOCUMENTS

| | | | |
|---|---|---|---|
| 6,690,243 B1 | 2/2004 | Henrion | |
| 6,970,048 B1* | 11/2005 | Devnath | H03B 27/00 331/108 B |
| 6,987,425 B1* | 1/2006 | Sutardja | H03B 1/04 331/117 FE |
| 7,005,930 B1 | 2/2006 | Kim et al. | |
| 7,199,675 B2* | 4/2007 | Lee | H03B 27/00 331/117 FE |
| 7,656,239 B2* | 2/2010 | Bietti | H03K 3/0322 331/108 B |
| 8,258,887 B1* | 9/2012 | Nedovic | H03B 27/00 327/238 |
| 8,583,072 B1* | 11/2013 | Ciubotaru | H03K 3/0322 455/318 |
| 2004/0251975 A1* | 12/2004 | Li | H03B 27/00 331/46 |
| 2005/0078766 A1* | 4/2005 | Simon | H04B 1/0003 375/296 |
| 2005/0265053 A1* | 12/2005 | Higashi | H03B 27/00 363/71 |
| 2010/0164633 A1* | 7/2010 | Hoshino | H03B 27/00 331/17 |
| 2017/0104455 A1 | 4/2017 | Tohidian et al. | |
| 2018/0351510 A1* | 12/2018 | Xue | H03B 5/1228 |

OTHER PUBLICATIONS

Yang, et al., "Back-Gated CMOS on SOIAS for Dynamic Threshold Voltage Control", IEEE Transactions on Electron Devices, vol. 44, No. 5, May 1997, May 1997, 10 pages.

* cited by examiner

OSCILLATION SIGNAL PRODUCTION

TECHNICAL FIELD

This disclosure relates generally to wireless communications with electronic devices and, more specifically, to producing oscillation signals that can have multiple different phases.

BACKGROUND

Electronic devices include traditional computing devices such as desktop computers, notebook computers, smartphones, wearable devices like a smartwatch, internet servers, and so forth. However, electronic devices also include other types of computing devices such as intelligent voice assistants, thermostats, automotive electronics, medical devices, robotics, devices embedded in other machines like refrigerators and industrial tools, Internet of Things (IoT) devices, and so forth. These various electronic devices provide services relating to productivity, remote communication, social interaction, security, health and safety, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between or among different electronic devices using wireless or wired signals that are transmitted over one or more networks, such as the Internet or a cellular network. Electronic communications therefore include both wireless and wired transmissions and receptions. To conduct such electronic communications, an electronic device uses a transceiver, such as a wireless transceiver.

Electronic communications can therefore be realized by propagating signals between two wireless transceivers of two different electronic devices. For example, using a wireless transmitter, a smart phone can transmit a wireless signal to a base station over an air medium as part of an uplink communication to support a mobile service. Using a wireless receiver, the smart phone can receive a wireless signal from the base station via the air medium as part of a downlink communication to enable a mobile service. With a smart phone, for instance, mobile services can include phone and video calls, social media interactions, messaging, watching movies, sharing videos, performing searches, acquiring map information or navigational instructions, locating friends, transferring money, obtaining another service like a car ride, and so forth.

To provide these types of services, mobile electronic devices may use a wireless transceiver to communicate wireless signals in accordance with some wireless standard. Examples of wireless standards include an IEEE 802.11 Wi-Fi standard and a Fourth Generation (4G) cellular standard, both of which we use today with smartphones and other connected devices. However, efforts to enable a Fifth Generation (5G) wireless standard and a faster wireless local area network (WLAN) standard are ongoing. Next-generation 5G and/or WLAN wireless networks are expected to offer significantly higher bandwidths, shorter communication delays (e.g., lower latencies), and access to additional electromagnetic spectrum to widen the communication highways for more data traffic. Taken together, this means that exciting new wireless services can be provided to users, such as driverless vehicles, augmented reality (AR) and other mixed reality (MR) imaging, on-the-go 4K video streaming, ubiquitous sensors to keep people safe and to use natural resources more efficiently, real-time language translations, and so forth.

To make these new technologies more widely available, many wireless devices in addition to smart phones will be deployed, which is sometimes called the "Internet of Things" (IoT). Compared to today's use of wireless devices, tens of billions, and eventually trillions, of more devices are expected to be connected to the internet with the arrival of the Internet of Things. This will involve increased sharing of the electromagnetic spectrum. Further, to enable next-generation wireless technologies, wireless devices will be communicating with signals that use wider frequency ranges and that span bands located at higher frequencies of the electromagnetic spectrum as compared to those of previous wireless standards. These characteristics impose challenging new constraints on electronic devices and the components that enable wireless communications.

One component that facilitates wireless communications is the wireless interface, which can include a wireless transceiver and a radio-frequency front-end (RFFE). Unfortunately, the wireless interfaces designed for devices that operate in accordance with the 4G cellular standard and WLAN standards of today are not adequate for the 5G-capable and/or future-WLAN-standard-compliant devices of tomorrow, which devices will confront higher frequencies and more-stringent technical specifications.

Consequently, to facilitate the adoption of developing technologies and the deployment of wireless devices that can provide new capabilities and services, existing wireless interfaces will be replaced with those having designs that can handle the higher frequencies of 5G and/or future WLAN networks. Electrical engineers and other designers of electronic devices are therefore striving to develop new wireless interfaces that will enable the promise of such technologies to become a reality.

SUMMARY

The developing 5G and WLAN wireless standards are intended to establish broadband capabilities at higher frequencies in the gigahertz (GHz) range, including those with corresponding millimeter-sized wavelengths (e.g., mmW frequencies). To enable wireless communications with mmW frequencies, electronic devices will use signal beamforming. Beamforming entails transmitting a signal at multiple different phases. Communicating in accordance with a 5G and/or WLAN mmW standard is also expected to involve meeting stringent phase noise specifications. Further, with mobile or battery-powered devices, reducing power consumption provides extended run times between charges. It is challenging to accommodate these various factors for mmW-capable devices.

To address these various factors, example implementations described herein include an oscillator that produces oscillation signals. The oscillator includes a ring structure formed from multiple oscillation stages. Each oscillation stage includes a core oscillator having an inductive-capacitive (LC) tank that at least partially determines an oscillation frequency. The oscillation stages are coupled together in series in a chained arrangement to form a ring. To facilitate signal propagation around the ring of the oscillator, each respective oscillation stage also includes a transconductance amplifier (e.g., a Gm unit) that couples a preceding oscillation stage to a core oscillator of the respective oscillation stage. The core oscillator forwards an output signal to a transconductance amplifier of a succeeding oscillation stage. Further, each respective oscillation stage can provide a respective output signal at the oscillation frequency with a different respective phase. The oscillation frequency is based at least partly on the LC tank included with each oscillation stage. The respective phase offset for each respective output signal, or a phase shift step between consecutive output signals along the ring, is based on a quantity of oscillation stages that are coupled together in the oscillator.

Thus, example implementations of an oscillator as described herein can produce an oscillation signal at some oscillation frequency having multiple different phases, and with lower phase noise and reduced current consumption. However, in some circumstances, the oscillation frequency can be non-deterministic—e.g., can take one of two or more values by switching operational modes. To at least partially ameliorate this frequency uncertainty, some implementations include coupling capacitors across a transconductance amplifier of a given oscillation stage to port inter-stage current from a preceding oscillation stage to a core oscillator of the given oscillation stage to provide frequency stability. Also, varactors in an LC tank can exhibit a Q at mmW frequencies that may not be satisfactory for certain 5G and/or WLAN standards and/or that may impact AM/PM phase noise. In place of varactors, for some implementations, at least one transistor of a transconductance amplifier of a given oscillation stage is configured as a silicon-on-insulator metal-oxide-semiconductor (SOI MOS) device that includes at least one back-gate terminal. A back-gate bias voltage applied to the back-gate terminal can be changed to alter a threshold voltage of the transistor to adjust an oscillation frequency of the given oscillation stage without using a varactor in the LC tank. Additionally, some described implementations include both deploying coupling capacitors to stabilize an oscillation frequency and utilizing a back-gate bias voltage to adjust an oscillation frequency.

In an example aspect, an apparatus for radio-frequency (RF) oscillation signal production is disclosed. The apparatus includes an oscillator. The oscillator includes multiple oscillation stages coupled together in series into a ring. A respective oscillation stage of the multiple oscillation stages includes a transconductance amplifier and a core oscillator. The transconductance amplifier is coupled to a preceding oscillation stage. The core oscillator is coupled to the transconductance amplifier and to a succeeding oscillation stage. The core oscillator includes at least one output node configured to provide a respective output signal.

In an example aspect, a system for oscillation signal production is disclosed. The system includes an oscillator having multiple oscillation stages coupled together in series into a ring. A respective oscillation stage of the multiple oscillation stages includes a core oscillator coupled to a succeeding oscillation stage of the multiple oscillation stages. The core oscillator includes at least one output node configured to provide a respective output signal of the oscillator with a respective phase at an oscillation frequency. The respective oscillation stage also includes coupling means for coupling the core oscillator to a preceding oscillation stage of the multiple oscillation stages. The coupling means may comprise means for converting at least one voltage from the preceding oscillation stage to at least one current for the core oscillator.

In an example aspect, a method for radio-frequency (RF) oscillation signal production is disclosed. The method includes accepting at least one input voltage from a preceding oscillation stage and converting the at least one input voltage to at least one current. The method also includes providing the at least one current to a core oscillator of a respective oscillation stage, with the core oscillator including an inductor and a capacitor. The method additionally includes producing at least one output voltage responsive to the at least one current and based on the inductor and the capacitor. The method also includes forwarding the at least one output voltage to a succeeding oscillation stage. The method further includes presenting the at least one output voltage as a respective output signal having a respective phase corresponding to the respective oscillation stage.

In an example aspect, an apparatus for radio-frequency (RF) oscillation signal production is disclosed. The apparatus includes an oscillator including multiple oscillation stages coupled together in series into a ring. A respective oscillation stage of the multiple oscillation stages includes a plus input node, a minus input node, a plus output node, and a minus output node. The respective oscillation stage also includes a first plus transistor, a first minus transistor, a second plus transistor, and a second minus transistor. The first plus transistor includes a gate terminal, a source terminal, and a drain terminal, with the gate terminal coupled to the plus input node, and the drain terminal coupled to the minus output node. The first minus transistor includes a gate terminal, a source terminal, and a drain terminal, with the gate terminal coupled to the minus input node, and the drain terminal coupled to the plus output node. The second plus transistor includes a gate terminal, a source terminal, and a drain terminal, with the gate terminal coupled to the minus output node, and the drain terminal coupled to the plus output node. The second minus transistor includes a gate terminal, a source terminal, and a drain terminal, with the gate terminal coupled to the plus output node, and the drain terminal coupled to the minus output node.

BRIEF DESCRIPTION OF DRAWINGS

FIG. 7-1 depicts example voltages and currents in vector graphs for the portion of an oscillation stage shown in FIG. 6.

FIG. 7-2 depicts example frequencies and phase offsets in a graph for the portion of an oscillation stage shown in FIG. 6.

DETAILED DESCRIPTION

Figure 1:
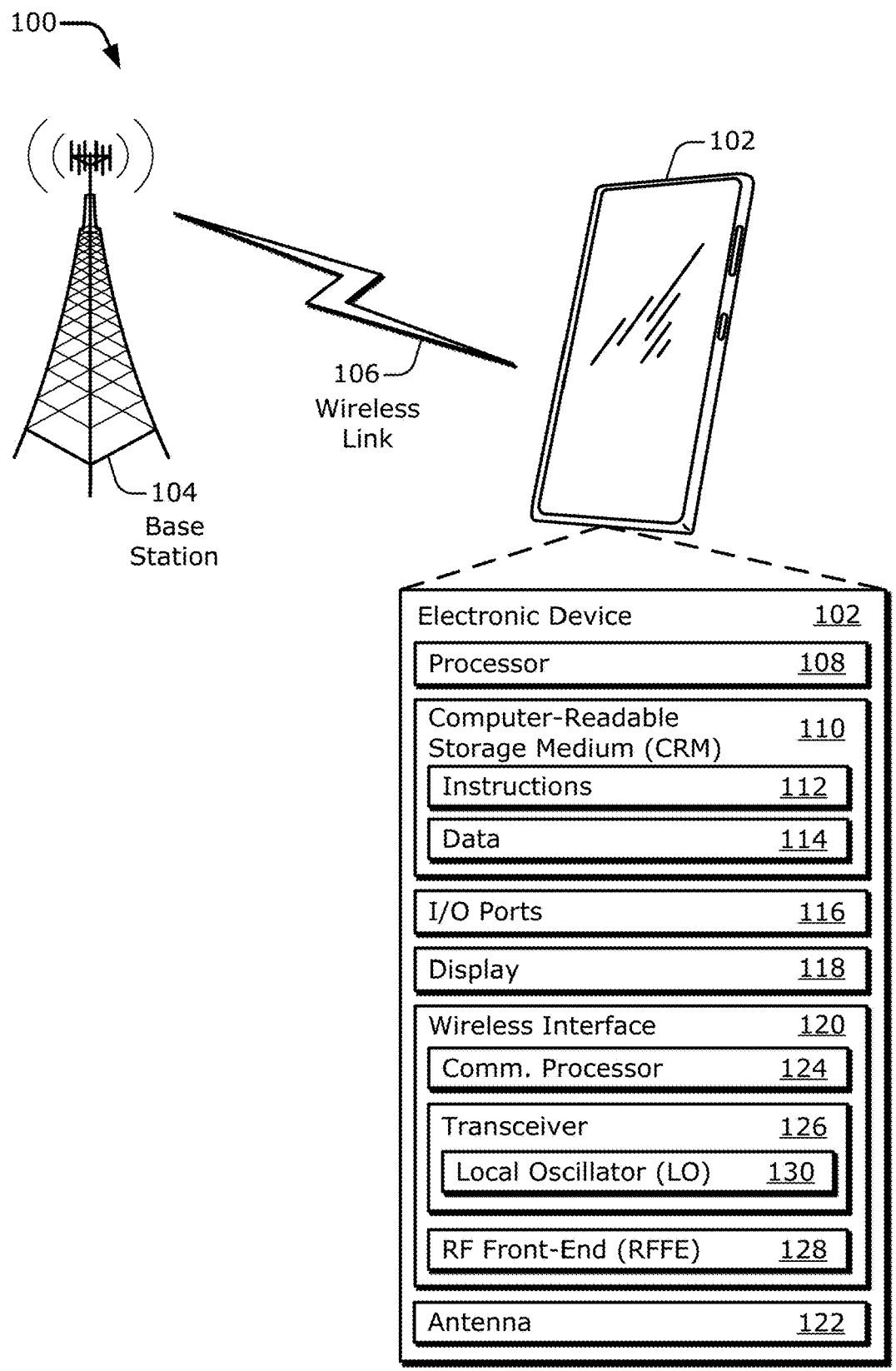
FIG. 1 illustrates an example environment that includes an electronic device having a transceiver with a local oscillator (LO) in which oscillation signal production can be implemented.

As compared to 4G and existing Wi-Fi networks, next-generation 5G and WLAN networks will utilize higher electromagnetic (EM) frequencies, such as millimeter wave (mmW) frequencies that can span approximately 3 to 300 Gigahertz (GHz) of the EM spectrum. Although higher frequencies can offer higher bandwidth and lower latency, higher frequencies also face challenges. For example, signals transmitted at higher frequencies are attenuated by the atmosphere more quickly and therefore have shorter intrinsic ranges at a given power level. To account for these naturally-shorter transmission distances, signals can be transmitted on signal beams that direct a signal toward a particular target, which is called antenna beamforming. Using beamforming, a transmission at a given power level can travel farther on a signal beam as compared to being transmitted omnidirectionally.

Thus, 5G and future WLAN electronic devices may utilize beamforming to direct signals toward receiving devices. The wireless interface of an electronic device is at least partially responsible for generating signal beams. To form a signal beam, a wireless interface emanates multiple versions of a transmission signal in which the versions are delayed in time, or phase shifted, with respect to each other. Accordingly, utilizing a local oscillator (LO) that produces an oscillation signal at multiple different phases, or phase offsets with respect to each other, can facilitate beamforming using at least one mixer and an antenna array.

In addition to beamforming, communicating in accordance with a 5G and/or WLAN mmW standard is expected to involve meeting stringent phase noise specifications. Further, with mobile or battery-powered devices, reducing power consumption provides extended run times between charges, so current consumption can be relevant. With regard to a local oscillator (LO) scenario, multiple phases of an oscillating signal can be created using a combination of a differential voltage-controlled oscillator (VCO), a polyphasic resistive-capacitive (RC) filter, and a vector modulator. However, to better accommodate the factors presented above, phase accuracy can be increased and current consumption can be reduced as compared to using a polyphasic RC filter and a vector modulator using techniques described herein.

Thus, to address these various factors, example described implementations provide for an oscillator that produces oscillation signals at multiple different phases. The oscillator includes a ring structure formed from multiple oscillation stages. Each oscillation stage includes a core oscillator having an inductive-capacitive (LC) tank that at least partially determines an oscillation frequency of an oscillation signal. The oscillation stages are coupled together in series in a chained arrangement to form a ring that includes a negative feedback feature to link one "end" of the chained arrangement to the other "end." To facilitate signal propagation around the ring of the oscillator, each respective oscillation stage also includes a transconductance amplifier (e.g., a Gm unit) that couples a preceding oscillation stage to a core oscillator of the respective oscillation stage. The core oscillator forwards an output signal to a transconductance amplifier of a succeeding oscillation stage.

Each respective oscillation stage can provide a respective output signal at a particular frequency with a different respective phase as the oscillation signal. The particular frequency is based at least partly on the LC tank included as part of each oscillation stage. The respective phase offset for each output signal, or phase shift step between consecutive output signals along the ring, is based on a quantity of oscillation stages that are coupled together in the oscillator. For instance, a higher quantity of oscillation stages results in a smaller phase shift step. In these manners, an oscillator can produce an oscillation signal at multiple different phases with battery-friendly power consumption and phase noise that can meet the stringent constraints of coming 5G and/or W-Fi standards.

Thus, example implementations of an oscillator as described herein can produce an oscillation signal having multiple different phases at some oscillation frequency, with lower phase noise and reduced current consumption. However, in some circumstances, the oscillation frequency can be non-deterministic—e.g., can take one of two or more values by switching oscillation modes. Non-deterministic oscillation frequencies can cause frequency uncertainty, leading to frequency jumps with a LO and an unlocked condition for a phase-locked loop (PLL). To at least partially ameliorate such frequency uncertainty, some implementations include one or more capacitors coupled across the transconductance amplifier of a given oscillation stage to divert or port inter-stage current from a preceding oscillation stage to a core oscillator of the given oscillation stage. The inter-stage current reinforces intra-stage current for a particular oscillation mode at the given oscillation stage to cause the core oscillator to settle into the particular mode. The capacitor therefore provides frequency stability.

As described herein, example implementations of an oscillator can produce an oscillation signal having multiple different phases at some oscillation frequency, with lower phase noise and reduced current consumption. Each core oscillator of each oscillation stage of the oscillator includes an LC tank that can employ a varactor to vary a capacitance to adjust the oscillation frequency. However, varactors can exhibit a relatively low Q at mmW frequencies and/or adversely impact AM/PM phase noise. In some implementations, to counteract these tendencies, at least one transistor of a transconductance amplifier of a given oscillation stage is configured as a silicon-on-insulator metal-oxide-semiconductor (SOI MOS) device that includes at least one back-gate terminal. A controller can change a back-gate bias voltage applied to the back-gate terminal to alter a threshold voltage of the transistor. The altered threshold voltage of the transistor changes a coupling current strength and therefore a total tank current of the associated core oscillator of the given oscillation stage. This affects a phase offset and therefore adjusts the oscillation frequency to produce an adjusted oscillation frequency without using a varactor in the LC tank. A varactor may therefore be omitted from the LC tank of the core oscillator. Further, described implementations also include both deploying coupling capacitors between a transconductance amplifier and an associated core oscillator of a given oscillation stage and utilizing a back-gate bias voltage to alter a threshold voltage of a transistor of the transconductance amplifier of the given oscillation stage.

FIG. 1 illustrates an example environment 100 that includes an electronic device 102 having a transceiver 126 with a local oscillator 130 (LO 130) in which oscillation signal production can be implemented. In the environment 100, the example electronic device 102 communicates with a base station 104 through a wireless link 106. As shown, the electronic device 102 is depicted as a smart phone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, medical device, fitness management device, wearable device such as intelligent glasses or smart watch, wireless power device (transmitter or receiver), and so forth.

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, terrestrial broadcast tower, access point, peer-to-peer device, mesh network node, fiber optic line, another electronic device generally as described above, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard, such as 3rd Generation Partnership Project Long-Term Evolution (3GPP LTE), IEEE 802.11, IEEE 802.16, Bluetooth™, and so forth.

As shown, the electronic device 102 includes a processor 108 and a computer-readable storage medium 110 (CRM 110). The processor 108 may include any type of processor, such as an application processor or a multi-core processor, that is configured to execute processor-executable instructions (e.g., code) stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, camera or other sensor ports, and so forth. The display 118 can be realized as a screen or projection that presents graphics provided by the electronic device 102, such as a user interface associated with an operating system, program, or application. Alternatively or additionally, the display 118 may be implemented as a display port or virtual interface through which graphical content of the electronic device 102 is communicated or presented.

The electronic device 102 also includes at least one wireless interface 120 and at least one antenna 122. The wireless interface 120 provides connectivity to respective networks and peer devices via a wireless link, which may be configured similar to or differently from the wireless link 106. Alternatively or additionally, the electronic device 102 may include a wired interface, such as an Ethernet or fiber optic transceiver for communicating over a wired local network, an intranet, or the Internet. The wireless interface 120 may facilitate communication over any suitable type of wireless network, such as a wireless local-area-network (LAN) (WLAN), peer-to-peer (P2P) network, mesh network, cellular network, wireless wide-area-network (WWAN), a navigational network (e.g., the Global Positioning System (GPS) of North America or another Global Navigation Satellite System (GNSS)), and/or wireless personal-area-network (WPAN). In the context of the example environment 100, the electronic device 102 can communicate various data and control information bidirectionally with the base station 104 via the wireless interface 120. However, the electronic device 102 may communicate directly with other peer devices, an alternative wireless network, and the like.

As shown, the wireless interface 120 includes at least one communication processor 124, at least one transceiver 126, and at least one radio-frequency front-end 128 (RF front-end 128). These components process data information, control information, and signals associated with communicating information for the electronic device 102 over the antenna 122. The communication processor 124 may be implemented as a system-on-chip (SoC), a modem baseband processor, or a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface 120 to implement various communication protocols or communication techniques.

The transceiver 126 includes circuitry and logic for filtering, amplification, channelization, and frequency translation. The frequency translation may include an up-conversion or a down-conversion of frequency that is performed in a single conversion operation, or through multiple conversion operations. The transceiver 126 can include filters, switches, amplifiers, mixers, and so forth for routing and conditioning signals that are transmitted or received via the antenna 122. Although not explicitly shown in FIG. 1, the wireless interface 120 can also include a digital-to-analog converter (DAC) or an analog-to-digital converter (ADC) to convert between analog signals and digital signals. The DAC and the ADC can be implemented as part of the communication processor 124, as part of the transceiver 126, or separately from both of them.

The components or circuitry of the transceiver 126 can be implemented in any suitable fashion, such as combined transceiver logic or separately as respective receiver and transmitter entities. In some cases, the transceiver 126 is implemented with multiple or different sections to implement respective receiving and transmitting operations (e.g., separate receive and transmit chains). The transceiver 126 may also include logic to perform in-phase/quadrature (I/Q) operations, such as synthesis, phase correction, modulation, demodulation, and the like.

As shown, the transceiver 126 includes at least one local oscillator 130 (LO 130). The local oscillator 130 can provide an oscillation signal having a particular frequency to another component of the transceiver 126, such as a mixer for frequency conversion. Configurable components of the transceiver 126, such as the local oscillator 130 or an amplifier, may be controlled by the communication processor 124 to implement communications in various modes, with different frequency bands, or using beamforming. Although the local oscillator 130 is depicted as being part of a transceiver 126, described implementations of a local oscillator 130 can alternatively be employed in other portions of the wireless interface 120 or of the electronic device 102 generally. Accordingly, the local oscillator 130 can implement at least one oscillator for oscillation signal production as described herein. An example usage scenario for a local oscillator 130 is described below with reference to FIG. 2, and an example of a local oscillator 130 is described below with reference to FIG. 3.

Generally, the RF front-end 128 includes one or more filters, switches, or amplifiers for conditioning signals received via the antenna 122 or signals to be transmitted via the antenna 122. The RF front-end 128 may also include other RF sensors and components, such as a peak detector, power meter, gain control block, antenna tuning circuit, phase shifter, diplexer, balun, and the like. Configurable components of the RF front-end 128, such as a phase shifter or gain control block, may be controlled by the communication processor 124 to implement communications in various modes, with different frequency bands, or using beamforming. Further, a local oscillator 130 may also or instead be included as part of the RF front-end 128, as is described below for an alternative implementation with reference to FIG. 2.

The antenna 122 can be implemented as at least one antenna array that include multiple antenna elements. Thus, as used herein, an "antenna" can refer to an individual antenna, an antenna array, or an antenna element of an antenna array, depending on context. To implement beamforming, different versions of a signal at different delays or phase shifts are provided to or accepted from the antenna 122 to transmit or receive a signal, respectively, using a signal beam. The local oscillator 130 can provide a signal at a given oscillation frequency with different phase shifts to support, for instance, antenna beamforming with an antenna array that is coupled to the wireless interface 120, as is described with reference to FIG. 2.

Figure 2:
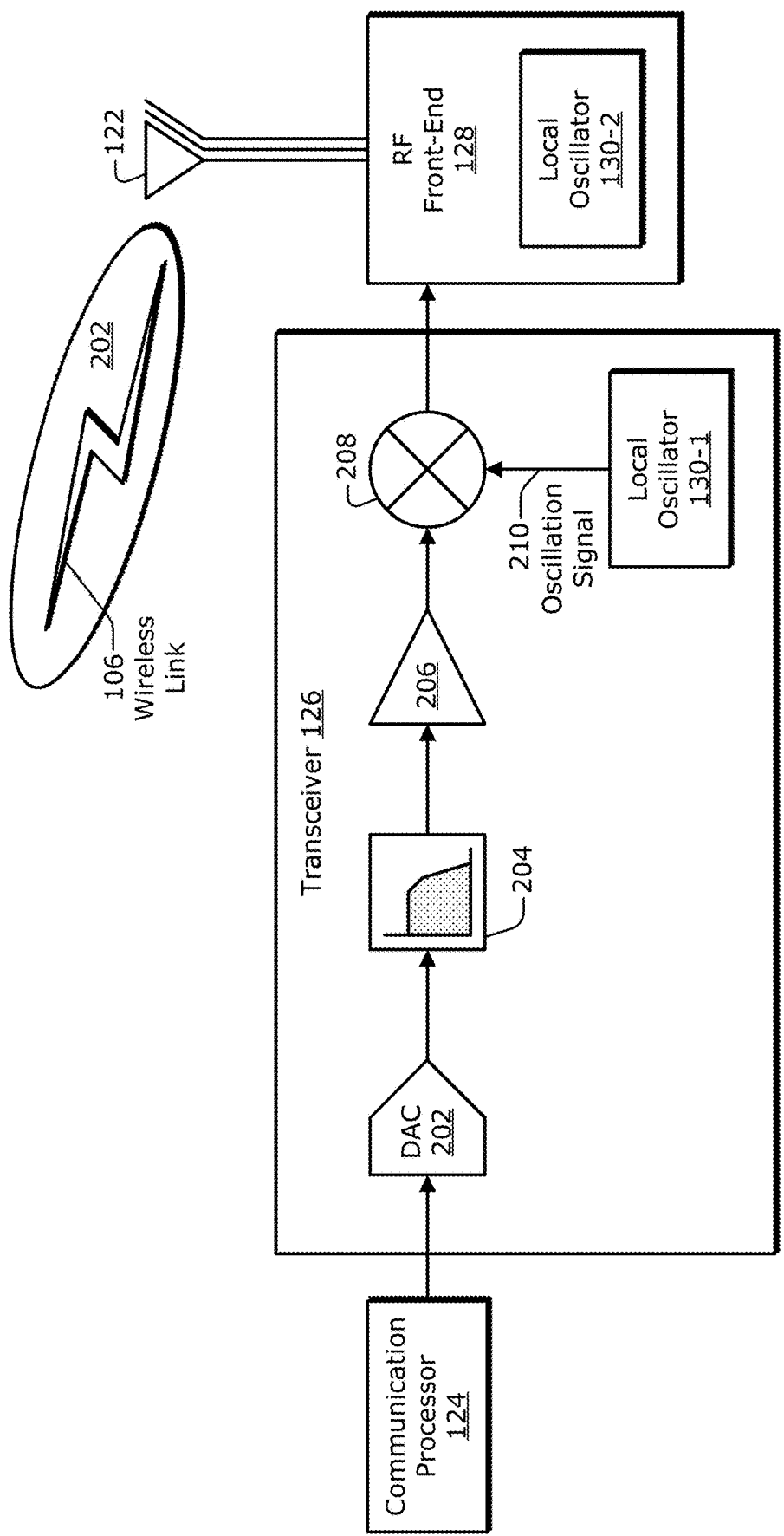
FIG. 2 illustrates an example transceiver including a local oscillator in which oscillation signal production can be implemented.

FIG. 2 illustrates an example usage scenario 200 with an example transceiver 126 including a local oscillator 130-1 in which oscillation signal production can be implemented. Here, the antenna 122 is realized as an antenna array. As shown for this example, the wireless interface 120 (of FIG. 1) is transmitting to the base station 104, via the antenna 122, an RF signal on the wireless link 106 using a signal beam 202. The components depicted in FIG. 2 may be configured as a transmit chain or transmit path of the wireless interface 120 or the transceiver 126. Although not shown, the wireless interface 120 may include a receive chain or receive path capable of performing complimentary operations to process received RF signals. The transmitted RF signal may be communicated in accordance with any suitable communication protocol or standard, and may represent an uplink portion of the wireless link 106.

As illustrated, the transceiver 126 includes at least one DAC 202, at least one baseband filter 204 (e.g., a lowpass or bandpass filter), at least one amplifier 206, and at least one mixer 208. In operation generally, the communication processor 124 encodes and modulates data to be transmitted and provides the modulated data to the DAC 202. The DAC 202 converts the modulated data provided by the communication processor 124 from a digital input signal to an analog output signal. The DAC 202 may be configured to receive digital values of any suitable size for conversion, such as values ranging from 8-bits to 20-bits in size. The DAC 202 may be implemented as a differential component.

The analog signal (e.g., a voltage- or current-based signal) output by the DAC 202 is then provided to the baseband filter 204 of the transceiver 126. The baseband filter 204, shown here as a lowpass filter, filters the analog signal output by the DAC 202 to remove high frequency artifacts or images that can be introduced by the digital-to-analog conversion operations of the DAC 202. Thus, the baseband filter 204 outputs a filtered signal. Similarly to the DAC 202, the baseband filter 204 can be implemented as a differential component to receive a differential analog signal that is output from the DAC 202 and to output a differential filtered signal.

The amplifier 206 of the transceiver 126 receives the filtered signal from the baseband filter 204 and amplifies the filtered signal to provide an amplified signal for up-conversion. In this example, the mixer 208 accepts the amplified signal from the amplifier 206 and an oscillation signal 210 (e.g., a clock signal) from the local oscillator 130-1. The oscillation signal 210 has at least one oscillation frequency and can include multiple different phases as described herein. Based on the oscillation signal 210, the mixer 208 up-converts the amplified signal to provide an RF signal to the RF front-end 128 or a driver amplifier (not shown) of the transceiver 126. For example, a driver amplifier of the transceiver 126 or the RF front-end 128 can amplify the RF signal prior to additional filtering or amplification via power amplifiers. Once amplified to a suitable power level for transmission, the RF signal is routed by switches of the RF front-end 128 to the antenna 122 for over-the-air transmission to the base station 104 using the signal beam 202.

This is but one example configuration of a transceiver 126 that includes a local oscillator 130-1 for oscillation signal production. The local oscillator 130 may be implemented in any other suitable transceiver configuration or within another component of the wireless interface 120, such as the RF front-end 128, or within another portion of the electronic device 102 generally. For example, additionally or alternatively to the local oscillator 130-1 being included in the transceiver 126, a local oscillator 130-2 can be included as part of the RF front-end 128. In some implementations, the transceiver 126 can upconvert a signal from baseband frequency to intermediate frequency. The signal at the intermediate frequency is communicated over a cable to the RF front-end 128, which may be at least partially realized as a radio-frequency integrated circuit (RFIC) that is relatively closer to the antenna 122. The RFIC may be implemented in a module that also includes one or more antennas 122. The RFIC upconverts the intermediate frequency to, for instance, a mmW transmission signal. The RFIC of the RF front-end 128 can include the local oscillator 130-2 to facilitate beamforming, phased array aspects, and so forth. Further, an oscillator of the local oscillator 130, as described below starting with FIG. 3, can be implemented in other components besides a local oscillator 130. For instance, an oscillator 302 may be coupled to, or included as part of, a phase-locked loop (PLL).

Figure 3:
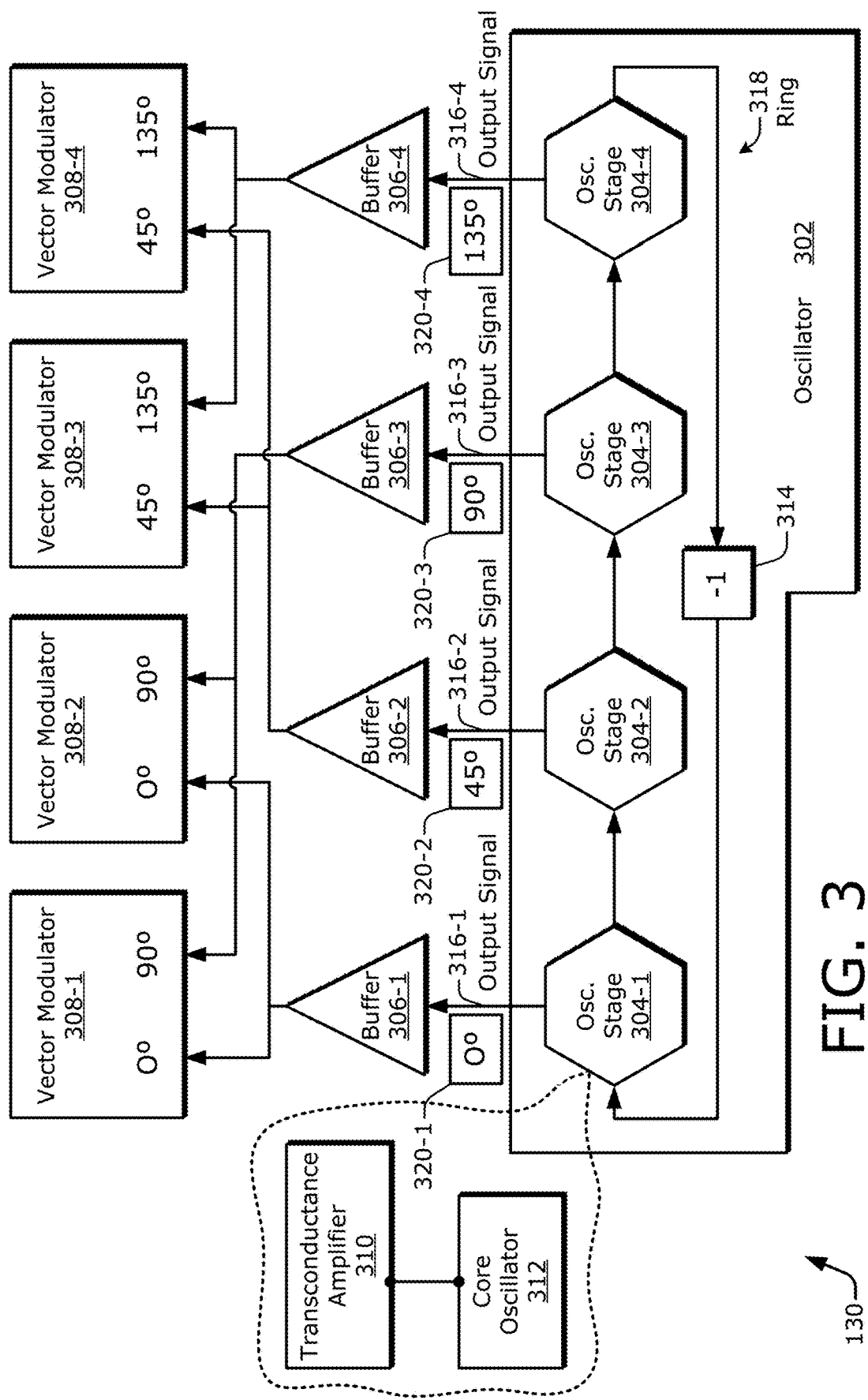
FIG. 3 illustrates an example local oscillator that includes an oscillator having a ring with multiple oscillation stages in which oscillation signal production can be implemented.

FIG. 3 illustrates an example local oscillator 130 that includes an oscillator 302 having a ring 318 with multiple oscillation stages 304-1 to 304-4 in which oscillation signal production can be implemented. The oscillator 302 can operate on signals in, for example, the radio-frequency (RF) portion of the electromagnetic spectrum, including those frequencies corresponding to millimeter wave (mmW) frequencies (e.g., 5 gigahertz (GHz) to 300 GHz). The multiple oscillation stages 304-1 to 304-4 are coupled together in series in a chained arrangement. One "end" of the chained arrangement is coupled to another (e.g., opposite) "end" using a negative feedback feature 314 to form the ring 318 to propagate an RF signal around the ring 318 and produce at least one RF oscillation signal. As shown, the ring 318 includes four oscillation stages 304-1 to 304-4: a first oscillation stage 304-1, a second oscillation stage 304-2, a third oscillation stage 304-3, and a fourth oscillation stage 304-4. However, an oscillator 302 can include more or fewer than four (4) oscillation stages. Also, although described with reference to FIG. 3 as being part of a local oscillator 130, the oscillator 302 can alternatively be employed separately and/or in a scenario that does not involve a local oscillator 130.

In example implementations, the oscillator 302 passes at least one signal from one oscillation stage 304 to another, such as from a given oscillation stage 304 to a succeeding oscillation stage 304. For instance, a signal can be passed from the second oscillation sage 304-2 to the third oscillation stage 304-3 and from the fourth oscillation stage 304-4 "back" to the first oscillation stage 304-1. Each respective oscillation stage 304 produces a respective output signal 316. Thus, the multiple oscillation stages 304-1, 304-2, 304-3, and 304-4 respectively produce multiple output signals 316-1, 316-2, 316-3, and 316-4. Each respective output signal 316 has a common oscillation frequency but a different respective phase 320. The multiple output signals 316-1, 316-2, 316-3, and 316-4 respectively have or correspond to multiple phases 320-1, 320-2, 320-3, and 320-4. In the example shown, these four phases are 0°, 45°, 90°, and 135°, respectively. However, the oscillator 302 can produce output signals with different phases, for example if a different quantity of oscillation stages are distributed along the ring 318. Although not explicitly indicated in FIG. 3, a signal passed between consecutive oscillation stages can comprise the output signal 316 produced by the oscillation stage 316 that is forwarding the signal.

The example local oscillator 130, as depicted in FIG. 3, also includes multiple buffers 306-1 to 306-4 and multiple vector modulators 308-1 to 308-4. The multiple vector modulators 308-1 to 308-4 can provide the oscillation signal 210 illustrated in FIG. 2. However, in other implementations in which the oscillator 302 is not necessarily employed as part of a local oscillator 130, the output signal 316 can comprise an oscillation signal generated by the oscillator 302. Each vector modulator 308 is configured to accept two signals having different phases, such as two signals that are offset by a 90° phase difference. In operation, each respective output signal 316 of the multiple output signals 316-1, 316-2, 316-3, and 316-4 is provided to a respective buffer 306 of the multiple buffers 306-1, 306-2, 306-3, and 306-4. Thus, each buffer 306 receives an output signal 316 having a different phase 320.

Each buffer 306 forwards a respective output signal 316 to at least one vector modulator 308. In the illustrated example, a first buffer 306-1 forwards a first output signal 316-1, which has a first phase 320-1 (0°), to a first vector modulator 308-1 and a second vector modulator 308-2. A second buffer 306-2 forwards a second output signal 316-2, which has a second phase 320-2 (45°), to a third vector modulator 308-3 and a fourth vector modulator 308-4. A third buffer 306-3 forwards a third output signal 316-3, which has a third phase 320-3 (90°), to the first vector modulator 308-1 and the second vector modulator 308-2. A fourth buffer 306-4 forwards a fourth output signal 316-4, which has a fourth phase 320-4 (135°), to the third vector modulator 308-3 and the fourth vector modulator 308-4.

With the illustrated local oscillator 130, current can be reduced, phase noise can be lowered, and phase accuracy can be increased as compared to an analogous implementation that lacks the oscillator 302 having the ring 318 and instead employs multiple RC polyphase filters. However, this is but one example implementation for a local oscillator 130. Other implementations of a local oscillator 130 can differ from these example aspects. Further, the oscillator 302 having the ring 318 with multiple oscillation stages can be deployed in other scenarios besides that of a local oscillator.

As shown on the left of FIG. 3, within the ring 318 of the oscillator 302, each oscillation stage 304 can include a transconductance amplifier 310 and a core oscillator 312. Example implementations of an oscillation stage 304, which includes these two components, are described below, starting with FIG. 4.

Figure 4:
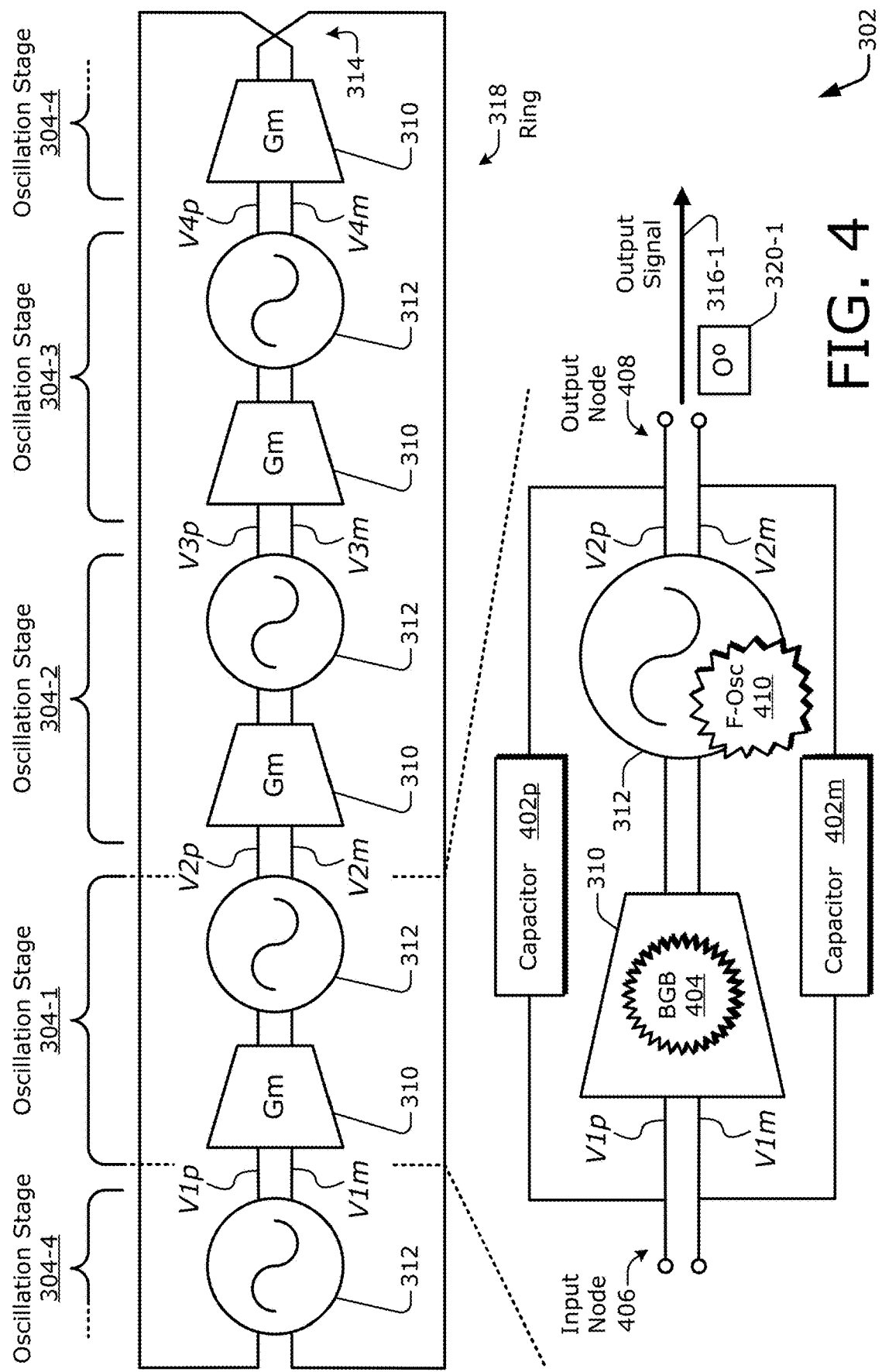
FIG. 4 illustrates an example oscillator including multiple oscillation stages in which a given oscillation stage includes a transconductance amplifier and a core oscillator.

FIG. 4 illustrates an example oscillator 302 including multiple oscillation stages 304-1 to 304-4 in which a given oscillation stage 304 includes a transconductance amplifier 310 and a core oscillator 312. The first, second, and third oscillation stages 304-1, 304-2, and 304-3 are depicted consecutively from left to right along the ring 318. The fourth oscillation stage 304-4 is depicted partially on the right and partially on the left of FIG. 4. In the embodiment illustrated in FIG. 4, the negative feedback feature 314 comprises a cross-coupling of the two differential lines to provide a 180° phase shift.

Figure 5:
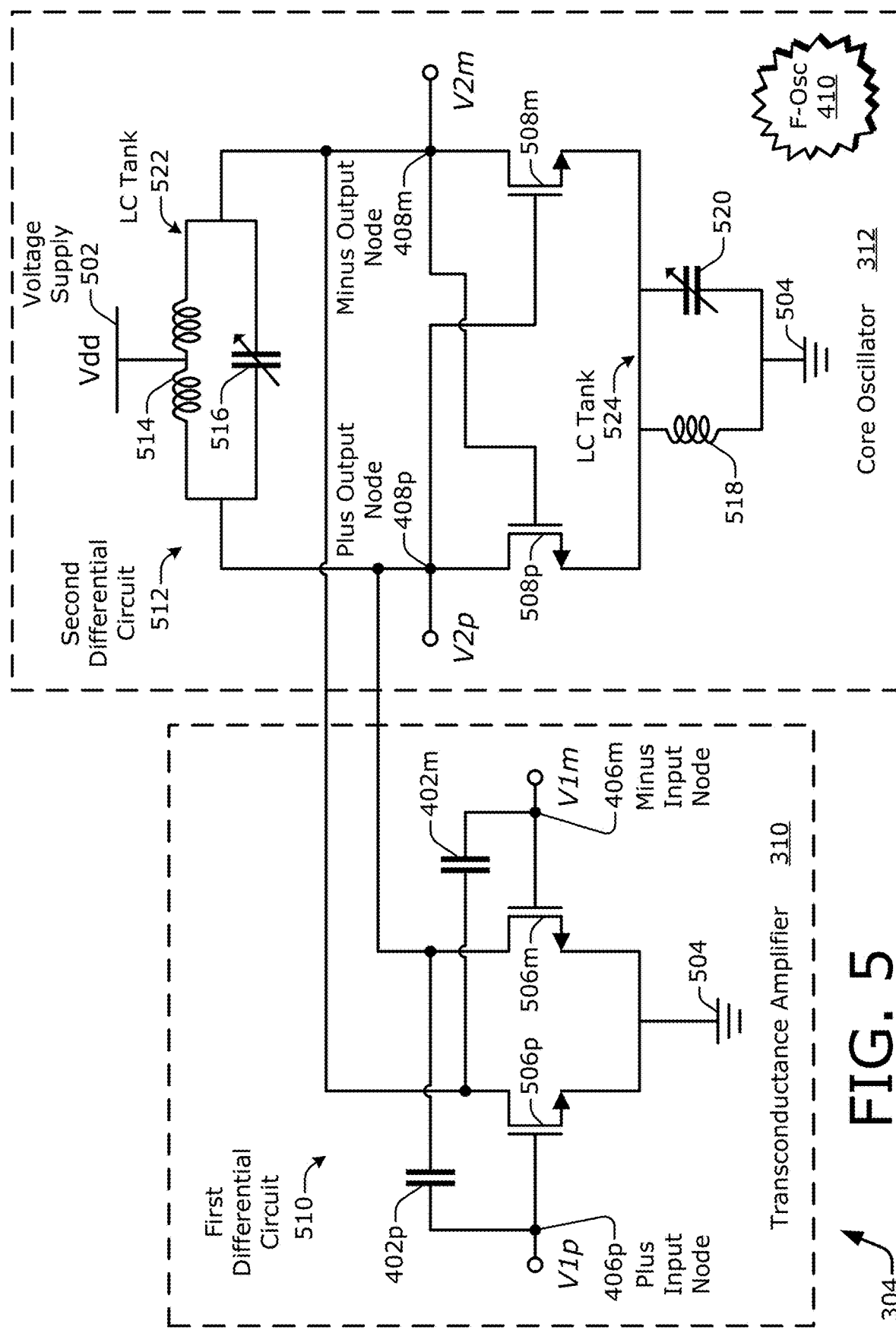
FIG. 5 illustrates, for a given oscillation stage, an example transconductance amplifier and an example core oscillator, with the transconductance amplifier including at least one capacitor.

In some aspects, the ring 318 of the oscillator 302 is implemented as a differential ring 318 with plus portions ("p") and minus portions ("m"). In such cases, the output signal 316 can comprise a differential signal. Thus, two differential lines—a plus line and a minus line—are depicted between consecutive components of the ring 318. Each oscillation stage 304 includes at least two components: a transconductance amplifier 310 and a core oscillator 312. The ring 318 can therefore be formed of an alternating series of transconductance amplifiers and core oscillators. As shown, the transconductance amplifier 310 may be implemented with a Gm unit that converts a voltage signal to a current signal. Thus, the transconductance amplifier 310 provides an example coupling mechanism for coupling the core oscillator 312 to a preceding (or succeeding) oscillation stage 304 of the multiple oscillation stages. Based partially on the current signal, as well as an inductive-capacitive (LC) tank (which is shown in FIG. 5), the core oscillator 312 produces the output signal 316 to have an oscillation frequency 410 (F-Osc 410).

An example oscillation stage 304, specifically the first oscillation stage 304-1, is depicted in the lower portion of FIG. 4 and described in greater detail here. The described aspects can be extrapolated to other oscillation stages. The first oscillation stage 304-1 includes at least one input node 406 and at least one output node 408. The input node 406 is coupled to a preceding oscillation stage 304, specifically a core oscillator 312 of the fourth oscillation stage 304-4. The output node 408 is coupled to a succeeding oscillation stage 304, specifically a transconductance amplifier 310 of the second oscillation stage 304-2. The input node 406, which corresponds to an input of the transconductance amplifier 310, can have a first plus voltage V1$p$ and a first minus voltage V1$m$. The output node 408, which corresponds to an output of the core oscillator 312, can have a second plus voltage V2$p$ and a second minus voltage V2$m$.

Thus, in example implementations, the oscillator 302 includes multiple oscillation stages 304-1 to 304-4 coupled together in series into the ring 318. Each respective oscillation stage 304 includes a transconductance amplifier 310 coupled to a preceding oscillation stage 304 and a core oscillator 312 coupled to the transconductance amplifier 310 and to a succeeding oscillation stage 304. The core oscillator 312 includes at least one output node 408 configured to provide a respective output signal 316.

With reference also to FIG. 3, the multiple oscillation stages 304-1 to 304-4 can produce multiple output signals 316-1, 316-2, 316-3, and 316-4 with different respective phase 320-1, 320-2, 320-3 and 320-4, respectively. A phase difference or phase shift step between consecutive oscillation stages is based at least partially on a quantity of oscillation stages included in a given ring 318. As shown in FIG. 3, with four oscillation stages 304-1 to 304-4, a phase shift step between consecutive oscillation stages is 45°. With three oscillation stages 304-1 to 304-3, a phase shift step between consecutive oscillation stages is 60°. With two oscillation stages 304-1 and 304-2, a phase shift step between consecutive oscillation stages is 90°. Generally, with N oscillation stages, a corresponding phase shift step between consecutive oscillation stages is 180°/N, with N representing a positive integer. Accordingly, a ring 318 of an oscillator 302 can include N stages to achieve a phase shift step of 180°/N.

In some implementations, each oscillation stage 304 includes at least one capacitor 402. The capacitor 402 is coupled across at least the transconductance amplifier 310 and can be coupled across the transconductance amplifier 310 and at least part of the core oscillator 312. For example, each capacitor 402 can be coupled between the at least one input node 406 and the at least one output node 408. As shown, a plus capacitor 402$p$ is coupled between the input node 406 having the first plus voltage V1$p$ and the output node 408 having the second plus voltage V2$p$. Similarly, a minus capacitor 402$m$ is coupled between the input node 406 having the first minus voltage V1$m$ and the output node 408 having the second minus voltage V2$m$. As described herein (particularly with respect to FIGS. 5 to 7-2), the plus and minus capacitors 402$p$ and 402$m$ can facilitate the establishment (e.g., the creation and/or maintenance) of a stable oscillation frequency 410 by the core oscillator 312.

In other implementations, at least one transistor (not shown in FIG. 4) of the transconductance amplifier 310 is implemented using back-gate biasing 404 (BGB 404). For example, at least one field effect transistor (FET) can be fabricated as a silicon-on-insulator metal-oxide-semiconductor (SOI MOS) device. The SOI MOS device therefore includes at least one back-gate terminal configured to enable alteration of a threshold voltage of the FET. As described herein (particularly with respect to FIGS. 8-10), altering the threshold voltage of the FET of the transconductance amplifier 310 can adjust (e.g., tune) the oscillation frequency 410 of the core oscillator 312 without relying on a varactor in an LC tank of the core oscillator 312. In still other implementations, an oscillation stage 304 can implement both the at least one capacitor 402 and the back-gate biasing 404 (BGB 404).

FIG. 5 illustrates an example oscillation stage 304 that includes a transconductance amplifier 310 and a core oscillator 312. As shown, the example transconductance amplifier 310 includes a first differential circuit 510, and the example core oscillator 312 includes a second differential circuit 512. The at least one input node 406 includes a plus input node 406$p$ and a minus input node 406$m$. The at least one output node 408 includes a plus output node 408$p$ and a minus output node 408$m$.

The plus input node 406$p$ has, is held to, or otherwise corresponds to the first plus voltage V1$p$. The minus input node 406$m$ has, is held to, or otherwise corresponds to the first minus voltage V1$m$. The plus output node 408$p$ has, is held to, or otherwise corresponds to the second plus voltage V2$p$. The minus output node 408$m$ has, is held to, or otherwise corresponds to the second minus voltage V2$m$. With reference also to FIG. 4, the plus input node 406$p$ and the minus input node 406$m$ of a given oscillation stage 304 are respectively coupled to a plus output node 408$p$ and a minus output node 408$m$ of a preceding oscillation stage 304. Similarly, the plus output node 408$p$ and the minus output node 408$m$ of a given oscillation stage 304 are respectively coupled to a plus input node 406$p$ and a minus input node 406$m$ of a succeeding oscillation stage 304.

In example implementations, the first differential circuit 510 includes a plus transistor 506$p$ (also referred to herein as a first plus transistor 506$p$) and a minus transistor 506$m$ (also referred to herein as a first minus transistor 506$m$). The second differential circuit 512 includes a plus transistor 508$p$ (also referred to herein as a second plus transistor 508$p$) and a minus transistor 508$m$ (also referred to herein as a second minus transistor 508$m$). These respective first and second pairs of plus and minus transistors are coupled together in respective differential arrangements. For the second plus transistor 508$p$ and the second minus transistor 508$m$, these two transistors are also cross-coupled together with respect to the gate and drain terminals thereof as shown.

Each transistor is implemented as a field-effect transistor (FET). Thus, each respective transistor respectively includes a gate terminal, a source terminal, and a drain terminal. More specifically, but by way of example, each transistor can be implemented as an n-type metal-oxide-semiconductor (NMOS) FET, or NMOSFET. However, oscillation signal production can be implemented with other transistor types. For example, a p-type metal-oxide-semiconductor (PMOS) FET, or PMOSFET, can be used for each transistor. Other alternative transistor types that can be used include a junction field-effect transistor (JFET), a metal-semiconductor field-effect transistor (MESFET), a bipolar junction transistor (BJT), and so forth.

The second differential circuit 512 is coupled between a voltage supply 502 (e.g., a power rail held to a supply voltage of Vdd) and a ground 504 (e.g., an equipotential node). The second differential circuit 512 includes an inductive-capacitive tank 522 (LC tank 522) and another inductive-capacitive tank 524 (LC tank 524). Each LC tank includes at least one inductor coupled in parallel with at least one capacitor. The LC tank 522 includes at least one inductor 514 and at least one capacitor 516. The LC tank 524 includes at least one inductor 518 and at least one capacitor 520. The inductor 514 is coupled via a tap node (e.g., a central tap node) to the voltage supply 502. Alternatively, the inductor 514 may include two inductors with a common node that is coupled to the voltage supply 502.

Generally, an inductive value of the inductor 514 and a capacitive value of the capacitor 516 at least partially establish the oscillation frequency 410. Similarly, an inductive value of the inductor 518 and a capacitive value of the capacitor 520 at least partially handle corresponding harmonic frequencies. As indicated in FIG. 5, the capacitor 516 or the capacitor 520 (or both) can be implemented as adjustable capacitors. For example, the capacitor 516 can be implemented with multiple individual switched capacitors that can be connected or disconnected to enable or disable, respectively, the individual switched capacitors to contribute to the LC tank 522 and therefore tune the core oscillator 312 to a desired oscillation frequency 410. As described below, varactors can be omitted from at least the capacitor 516 using back-gate biasing of at least one of the transistors of the transconductance amplifier 310. Further, in some aspects, at least the capacitor 516 can be implemented with a non-adjustable capacitor by relying on the back-gate biasing. In other aspects, the capacitor 516 can be implemented with an adjustable switched capacitor for coarse frequency tuning, and then back-gate biasing can be used for fine frequency tuning.

As illustrated in FIG. 5, the various transistors of the first and second differential circuits 510 and 512 can be coupled to each other, to the at least one input node 406, and to the at least one output node 408 as follows. For the first plus transistor 506p, the gate terminal is coupled to the plus input node 406p, and the drain terminal is coupled to the minus output node 408m. For the first minus transistor 506m, the gate terminal is coupled to the minus input node 406m, and the drain terminal is coupled to the plus output node 408p. For the second plus transistor 508p, the gate terminal is coupled to the minus output node 408m, and the drain terminal is coupled to the plus output node 408p. For the second minus transistor 508m, the gate terminal is coupled to the plus output node 408p, and the drain terminal is coupled to the minus output node 408m.

The source terminals of the first plus transistor 506p and the first minus transistor 506m are coupled to each other. Further, these two source terminals may be coupled to the ground 504. The source terminals of the second plus transistor 508p and the second minus transistor 508m are coupled to each other. Further, these two source terminals may be coupled to the LC tank 524. The LC tank 524 may be coupled between these two source terminals and the ground 504. On the other hand, the LC tank 522 is coupled between the plus output node 408p and the minus output node 408m. The LC tank 522 is therefore coupled between the drain terminal of the second plus transistor 508p and the drain terminal of the second minus transistor 508m. The LC tank 522 is also coupled to the voltage supply 502 via the inductor 514.

In some implementations, the oscillation stage 304 further includes at least one capacitor 402. The at least one capacitor 402 is coupled between the at least one input node 406 and the at least one output node 408 (as also depicted in FIG. 4). Here, the at least one capacitor 402 includes a plus capacitor 402p and a minus capacitor 402m, which are illustrated for convenience as part of the first differential circuit 510 of the transconductance amplifier 310. The plus capacitor 402p is coupled between the plus input node 406p and the plus output node 408p. The minus capacitor 402m is coupled between the minus input node 406m and the minus output node 408m. Thus, the plus capacitor 402p is coupled between the gate terminal of the first plus transistor 506p and the drain terminal of the second plus transistor 508p (as well as the drain terminal of the first minus transistor 506m).

Similarly, the minus capacitor 402m is coupled between the gate terminal of the first minus transistor 506m and the drain terminal of the second minus transistor 508m (as well as the drain terminal of the first plus transistor 506p). In a given oscillation stage 304, each capacitor 402 can inject or port an inter-stage coupling current (e.g., inject a positive or a negative inter-stage coupling current) that is received by the transconductance amplifier 310 from a preceding oscillation stage into the core oscillator 312 of the given oscillation stage 304. As described below with reference to FIGS. 6, 7-1, and 7-2, this inter-stage coupling current can stabilize the oscillation frequency 410.

Figure 6:
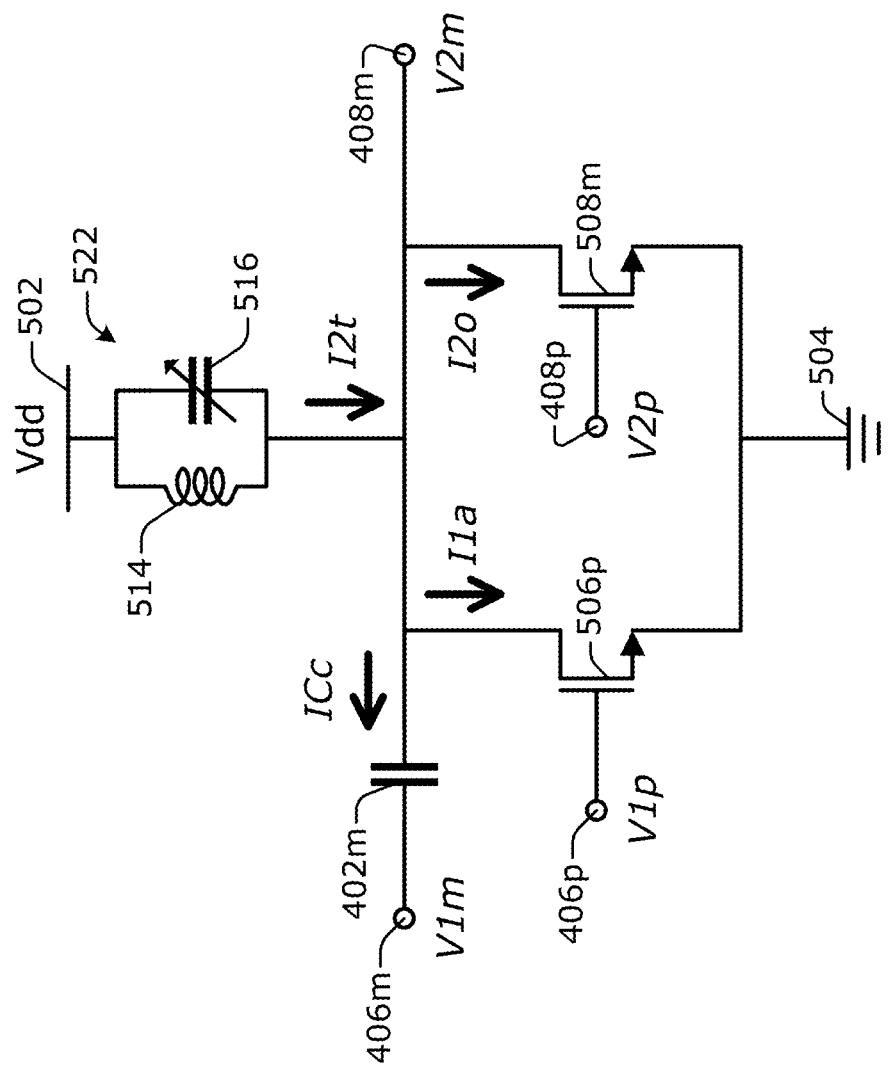
FIG. 6 depicts a portion of an oscillation stage that illustrates example current flows resulting from a capacitor that couples a transconductance amplifier to a core oscillator.

FIG. 6 depicts a portion 600 of an oscillation stage 304 that illustrates example current flows resulting from a capacitor 402 that couples a transconductance amplifier 310 to a core oscillator 312. For clarity with this analysis, the portion 600 includes the first plus transistor 506p, the second minus transistor 508m, and the minus capacitor 402m, in addition to the LC tank 522 and the voltage supply 502 (but omits the other two transistors and plus capacitor 402p). However, the analysis also applies to the other half of the oscillation stage 304. FIG. 6 also depicts multiple currents: a total tank current I2t, an oscillator current I2o, an amplifier current I1a, and an inter-stage coupling current ICc.

Without a capacitor, the oscillator has two equally-probable oscillation modes. In a first oscillation mode, the first plus voltage V1p leads the second plus voltage V2p. In a second oscillation mode, the second plus voltage V2p leads the first plus voltage V1p. This occurs because the total tank current I2t is equal in both oscillation modes.

To counteract this potential instability, the capacitor 402 is included. In the portion 600, the coupling current ICc is ported over as part of the inter-stage coupling current. This coupling current ICc causes the total tank current I2t to have different magnitudes in the two oscillation modes, as is described with reference to FIGS. 7-1 and 7-2.

Figures 1, 7:
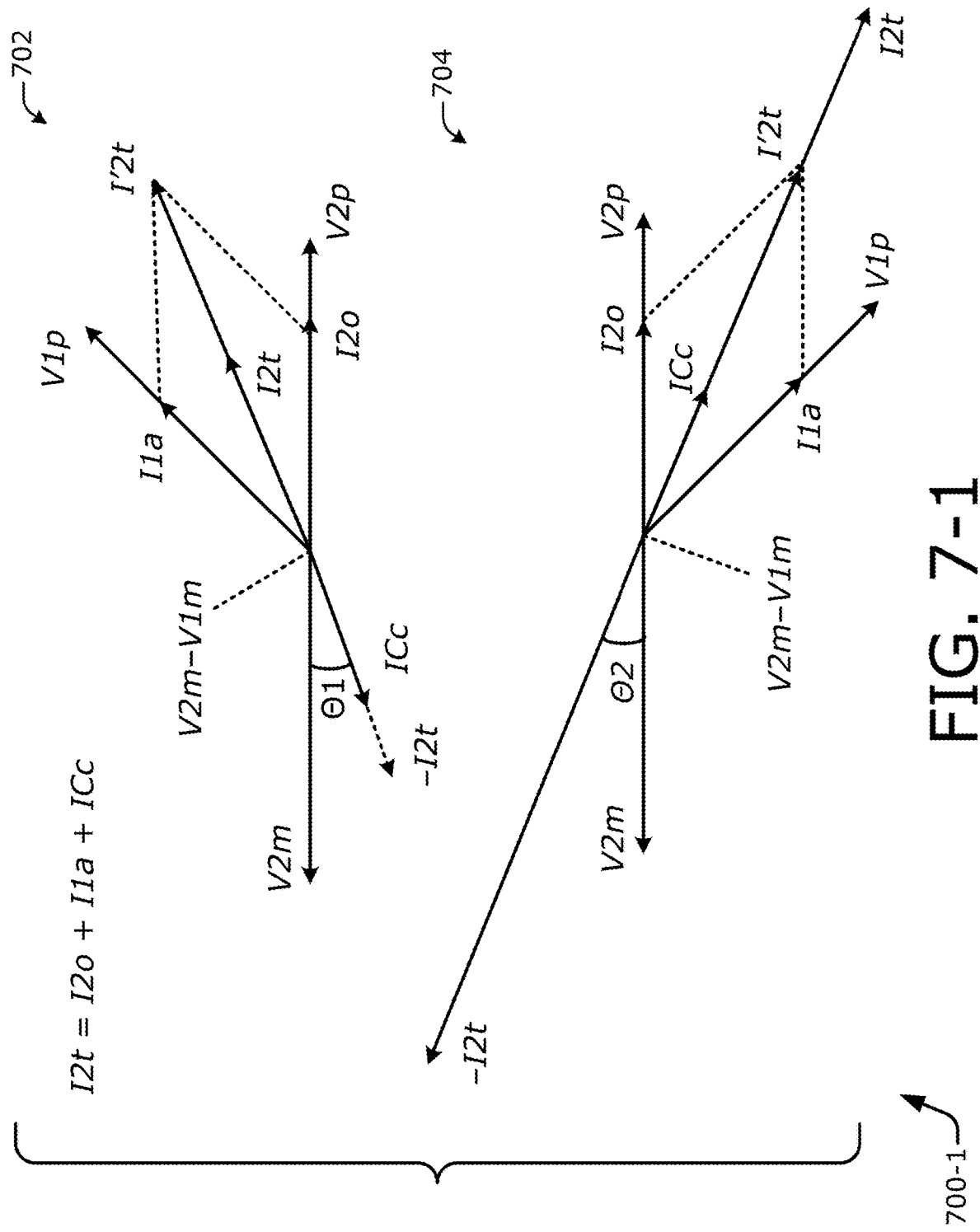
Figures 2, 7:
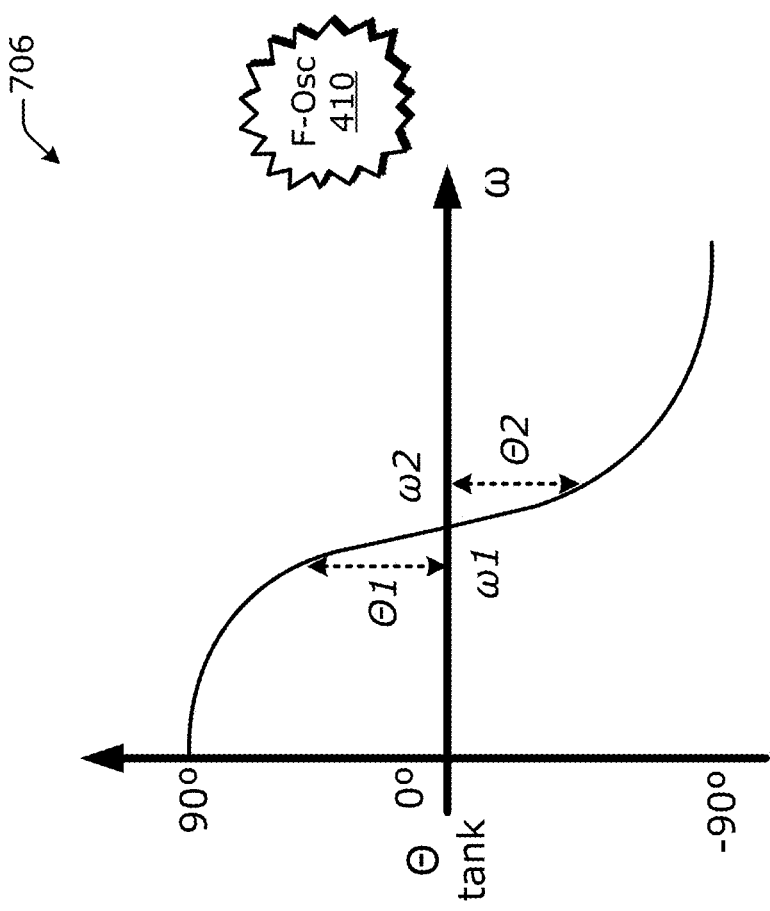

FIG. 7-1 depicts, generally at 700-1, example voltages and currents in vector graphs 702 and 704 for the portion 600 of an oscillation stage 304 as shown in FIG. 6. The total tank current I2t is equal to a sum of the oscillator current I2o, the amplifier current I1a, and the inter-stage coupling current ICc (e.g., I2t=I2o+I1a+ICc). The total tank current that would exist without a capacitor 402 is denoted with "I'2t" in FIG. 7-1. The total tank current that results from the inclusion of a capacitor 402 is denoted with "I2t." In both the vector graphs 702 and 704, the second plus voltage V2p points rightward; however, a direction of the first plus voltage V1p varies between the two graphs.

FIG. 7-2 depicts, generally at 700-2, example frequencies and phase offsets in a graph 706 for the portion 600 of an oscillation stage 304 as shown in FIG. 6. A tank phase offset Θ from +90° to −90° is graphed versus an oscillation frequency ω. As shown, a first oscillation frequency ω1 corresponds to a first phase offset Θ1. A second oscillation frequency ω2 corresponds to a second phase offset Θ2.

With reference to the graph 706 and the vector graph 702, which corresponds to a first mode of oscillation with a first oscillation frequency ω1, the second plus voltage V2p leads the first plus voltage V1p. In the first oscillation mode, the inter-stage coupling current ICc is 180° out-of-phase with the total tank current I2t and results in a first phase offset Θ1. This partially cancels the total tank current I2t and therefore weakens the first mode of oscillation.

With reference to the graph 706 and the vector graph 704, which corresponds to a second mode of oscillation with a second oscillation frequency ω2, the first plus voltage V1p leads the second plus voltage V2p. In the second oscillation mode, the inter-stage coupling current ICc is in-phase with the total tank current I2t and results in a second phase offset Θ2. This is additive to the total tank current I2t and therefore strengthens the second mode of oscillation. Accordingly, with the inclusion of the capacitor 402, the ring 318 settles into the second mode of oscillation with the second oscillation frequency ω2. In this manner, a capacitor 402 included at each oscillation stage 304 can cause the oscillator 302 to have a deterministic oscillation frequency 410. Thus, the at least one capacitor 402 provides an example capacitive coupling mechanism for stabilizing the oscillation frequency 410 of a respective output signal 316.

Figure 8:
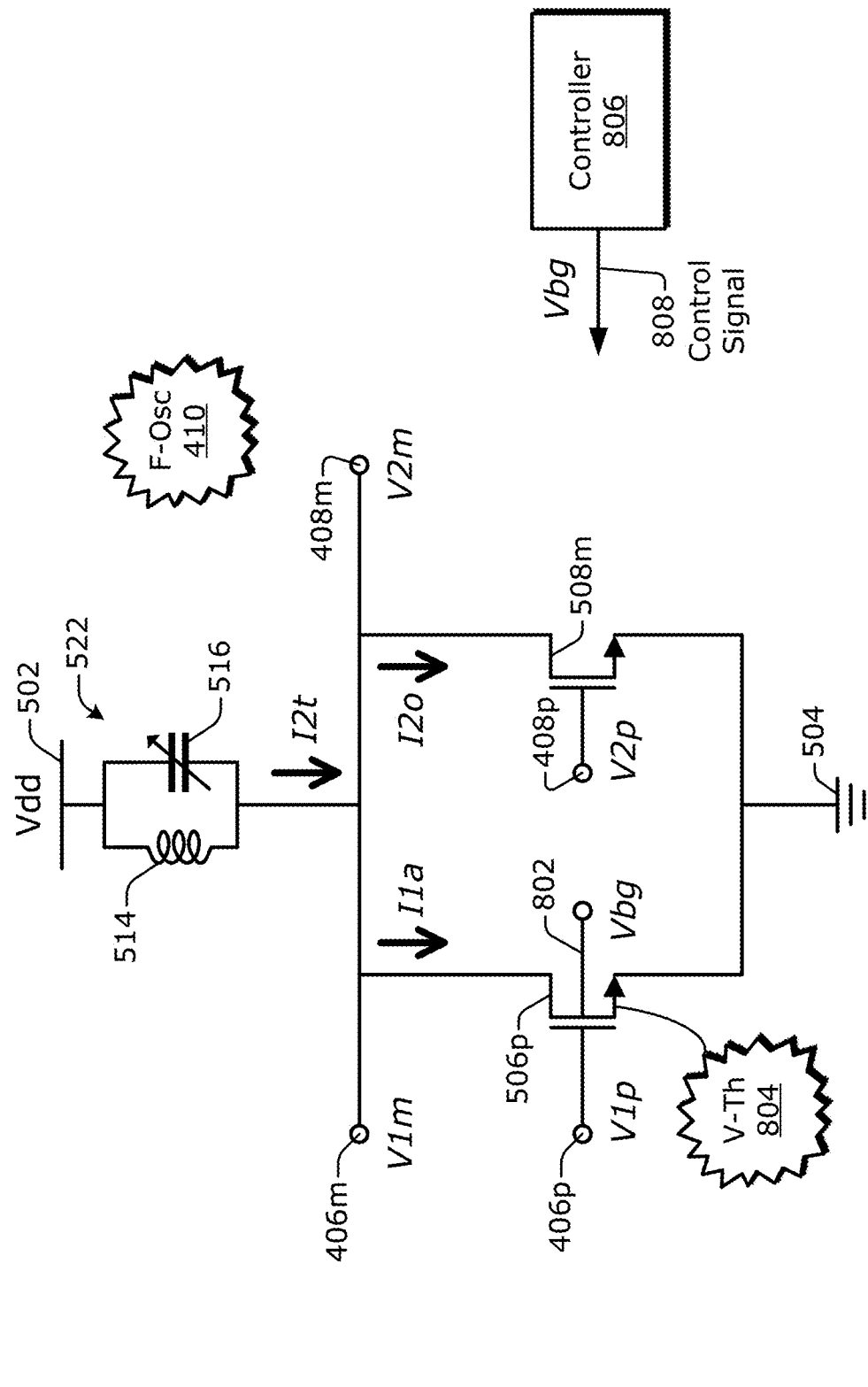
FIG. 8 depicts a portion of an oscillation stage that illustrates example current flows relating to a transistor of a transconductance amplifier, with the transistor implemented using silicon-on-insulator metal-oxide-semiconductor (SOI MOS) technology and including a back-gate terminal.

FIG. 8 depicts a portion 800 of an oscillation stage 304 that illustrates example current flows relating to a transistor 506 of a transconductance amplifier 310, with the transistor 506 implemented using silicon-on-insulator metal-oxide-semiconductor (SOI MOS) technology. Accordingly, the transistor 506 includes a back-gate terminal 802. For clarity with this analysis, the portion 800 includes the first plus transistor 506p and the second minus transistor 508m, in addition to the LC tank 522 and the voltage supply 502 (but omits the other two transistors). However, the analysis also applies to the other half of the oscillation stage 304. FIG. 8 further depicts multiple currents: a total tank current I2t, an oscillator current I2o, and an amplifier current I1a. Also shown is a controller 806 that can generate or provide a control signal 808.

As indicated above, the capacitor 516 can include a varactor to tune the oscillation frequency 410 of the core oscillator 312. However, described implementations enable such a varactor to be omitted from the capacitor 516. To do so, the at least one transistor 506 is configured to enable adjustments to the transistor 506 that result in an adjustment to (e.g., a tuning of) the oscillation frequency 410.

Figure 10:
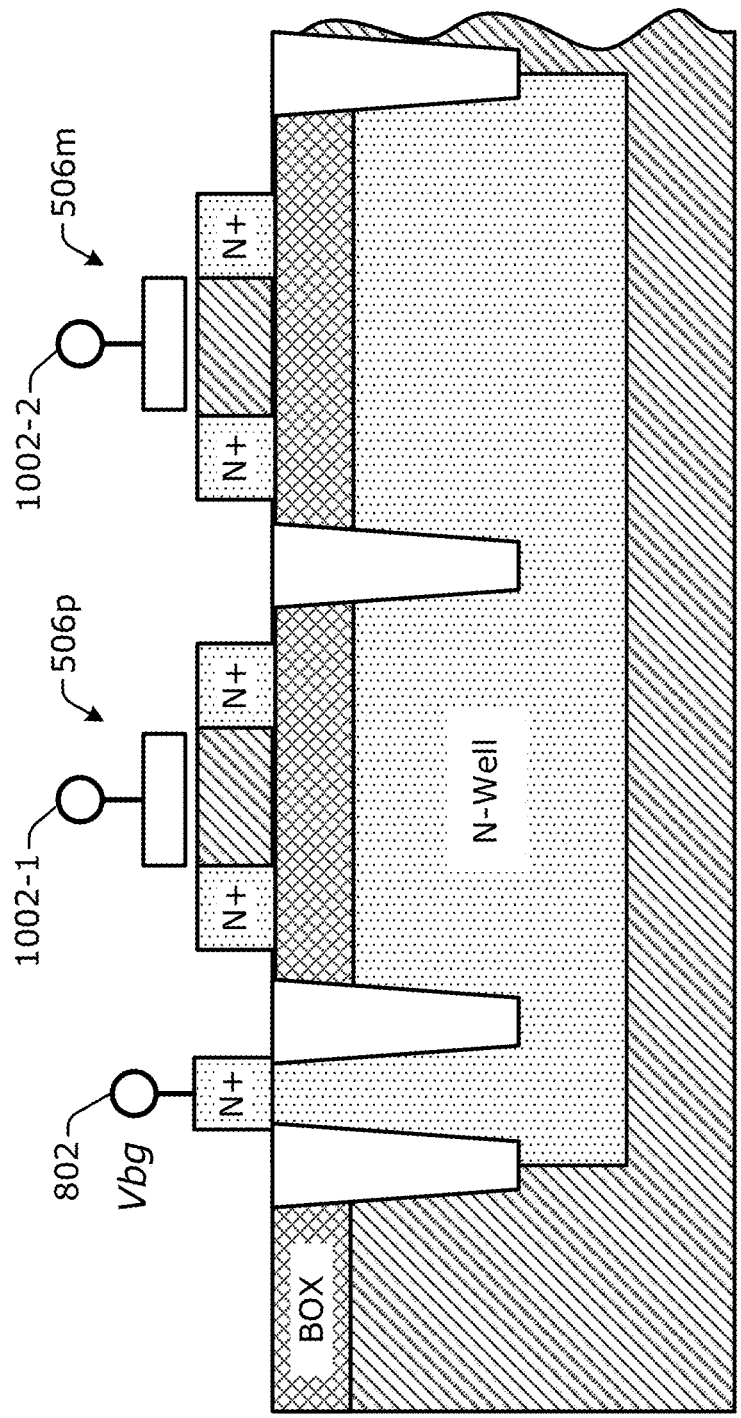
FIG. 10 illustrates, in a cross-section view, an example of two transistors implemented using silicon-on-insulator metal-oxide-semiconductor (SOI MOS) technology.

In some implementations, at least one transistor 506 of the transconductance amplifier 310, which is the plus transistor 506p in this illustrated example, is fabricated using silicon-on-insulator metal-oxide-semiconductor (SOI MOS) technology. Thus, the plus transistor 506p includes a back-gate terminal 802. By changing a back-gate voltage Vbg that is applied to the back-gate terminal 802, a threshold voltage 804 (V-Th 804) is altered. Altering the threshold voltage 804 can adjust the oscillation frequency 410, as is described below. From a fabrication perspective, both the plus transistor 506p and the minus transistor 506m can be disposed within the same well (as shown in FIG. 10). If so, one back-gate terminal 802 can be used to alter the threshold voltage 804 of both the plus and minus transistors 506p and 506m. On the other hand, if the plus transistor 506p and the minus transistor 506m are disposed in separate respective wells, then each can be associated with a separate respective back-gate terminal 802 to permit the respective threshold voltages 804 to be independently controlled.

In an example operation, the controller 806 generates the back-gate voltage Vbg and provides the back-gate voltage Vbg to the back-gate terminal 802 of the plus transistor 506p via the control signal 808. The controller 806 changes the back-gate voltage Vbg based on a desired oscillation frequency 410. The controller 806 can include at least one processor and CRM, which stores computer-executable instructions (such as the application processor 108, the CRM 110, and the instructions 112 of FIG. 1). The processor and the CRM can be localized at one module or one integrated circuit chip or can be distributed across multiple modules or chips. Together, a processor and associated instructions can be realized in separate circuitry, fixed logic circuitry, hard-coded logic, and so forth. The controller 806 can be implemented as part of the wireless interface 120, the application processor 108, a general-purpose processor, some combination thereof, and so forth. For example, the controller 806 can be implemented as part of the communication processor 124 or the transceiver 126. In general, the controller 806 can control at least some of the configurable components of the transceiver 126.

Figure 9:
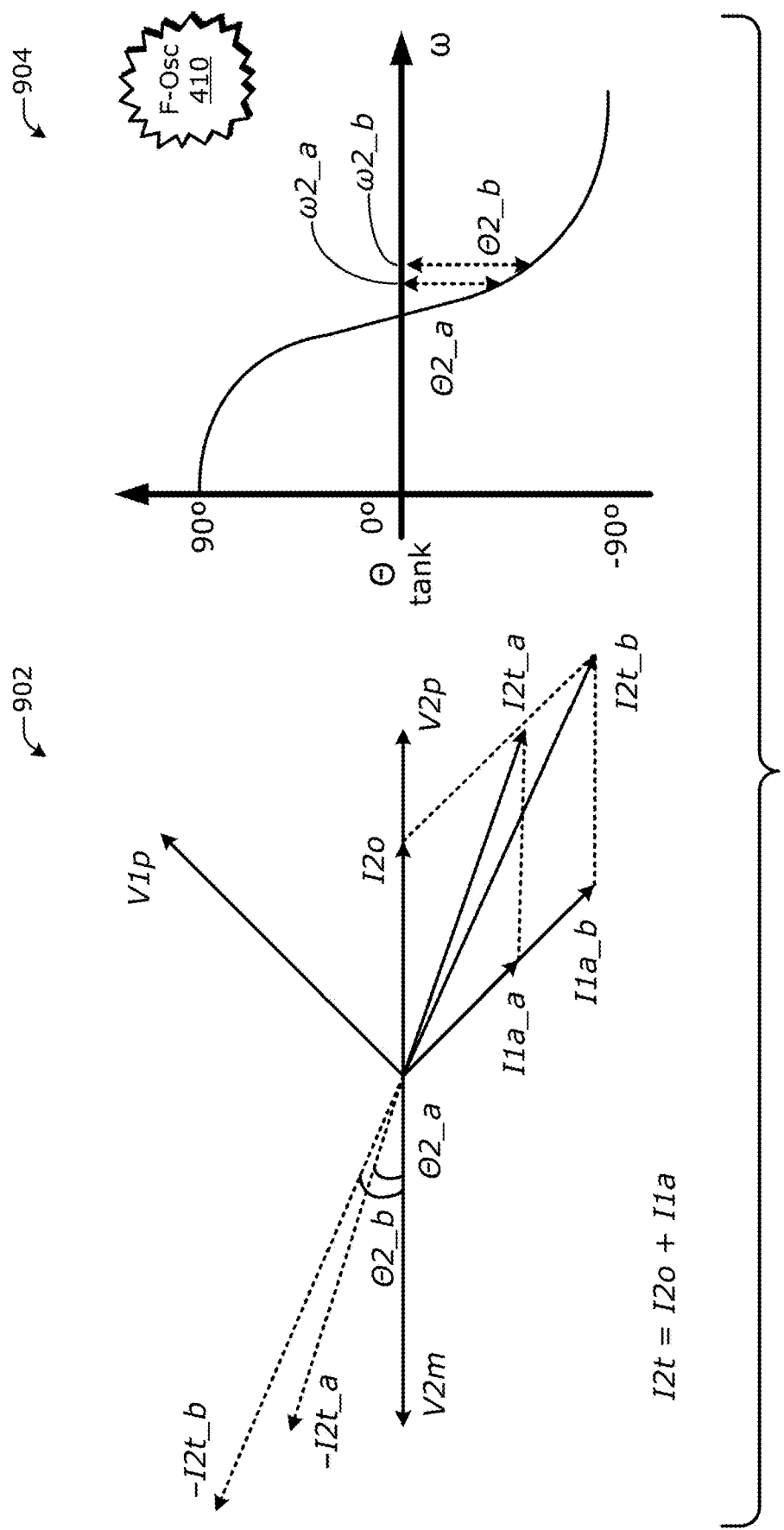
FIG. 9 depicts example voltages and currents in a vector graph and example phase shifts in another graph for the portion of an oscillation stage shown in FIG. 8.

FIG. 9 depicts, generally at 900, example voltages and currents in vector form at a vector graph 902 and example phase shifts at a graph 904 for the portion 800 of an oscillation stage 304 as shown in FIG. 8. Here, the total tank current I2t is equal to a sum of the oscillator current I2o and the amplifier current I1a (e.g., I2t=I2o+I1a). In the vector graph 902, the second plus voltage V2p points rightward and leads the first plus voltage V1p. The currents and phase offsets are depicted at two different voltage levels for the back-gate bias voltage Vbg. These two back-gate bias voltage levels are represented by "a" and "b." Thus, the amplifier current I1a has an "I1a_a" and an "I1a_b," and the total tank current I2t has an "I2t_a" and an "I2t_b." The phase offset Θ2 has an "Θ2_a" and a "Θ2_b."

Applying back-gate bias tuning to the transconductance amplifier 310 changes a magnitude of the amplifier current: I1a_a→I1a_b. This therefore changes a magnitude of the total tank current: I2t_a→I2t_b. The changed (e.g., increased in the vector graph 902) total tank current I2t changes (e.g., increases) the phase offset: Θ2_a→Θ2_b. This increases the phase offset Θ2 farther away from a natural resonant frequency. With reference to the graph 904, a phase offset of Θ of the LC tank towards, e.g., the −90° side, changes the oscillation frequency ω. This enables a frequency tuning of the oscillation frequency 410: ω2_a→ω2_b. In these manners, the controller 806 can tune the oscillation frequency 410 of the oscillator 302 by changing the back-gate voltage Vbg that is applied to the back-gate terminal 802 of at least the plus transistor 506p using the control signal 808. Changing the back-gate voltage Vbg applied to the back-gate terminal 802 adjusts the threshold voltage 804, which changes the amplifier current I1a. Thus, a transistor 506 that is implemented to include a back-gate terminal 802 provides an example bias mechanism for tuning the oscillation frequency 410 of a respective output signal 316. The at least one transistor 506 of the transconductance amplifier 310 can be fabricated in a variety of ways to include a back-gate terminal 802, some examples of which are described with reference to FIG. 10.

FIG. 10 illustrates, in a cross-section view 1000, an example of two transistors implemented using silicon-on-insulator metal-oxide-semiconductor (SOI MOS) technology. In some aspects, at least a portion of the first differential circuit 510 (of FIG. 5), such as the at least one transistor 506, is implemented using silicon-on-insulator (SOI) semiconductor process technology. In this example, each of the plus transistor 506p and the minus transistor 506m of the transconductance amplifier 310 is implemented as a fully-depleted (FD) SOI FET with back-gate bias. The various illustrated characteristics of the cross-section view 1000 are not necessarily depicted to scale.

As shown, the plus transistor 506p and the minus transistor 506m are realized as NFETs using a common n-well. A barrier oxide (BOX) separates these two transistors from an n-well layer ("N-Well"). However, the BOX does not separate the back-gate terminal 802 from the n-well material. In this example, the plus transistor 506p and the minus transistor 506m "share" the back-gate terminal 802. Consequently, changing the back-gate voltage Vbg that is applied to the back-gate terminal 802 can change the threshold voltage 804 of both the plus transistor 506p and the minus transistor 506m. Alternatively, each of the plus transistor 506p and the minus transistor 506m may be associated with a respective back-gate terminal 802 that is coupled to separate respective n-wells.

Generally, each respective transistor 506 includes a respective "front gate" terminal—e.g., the gate terminals 1002-1 and 1002-2. The silicon film thickness can be less than or equal to half of a depletion width of the bulk device. Surface potentials at the front and back interfaces are strongly coupled to each other. These surface potentials are capacitively coupled to the front-gate and the substrate through the front-gate oxide and the buried oxide (BOX), respectively. Therefore, the front-gate and the back-gate both possess a measure of control of the charge in the silicon film. The back-gate bias, for instance, impacts the threshold voltage and the drain current of the MOS devices.

Figure 11:
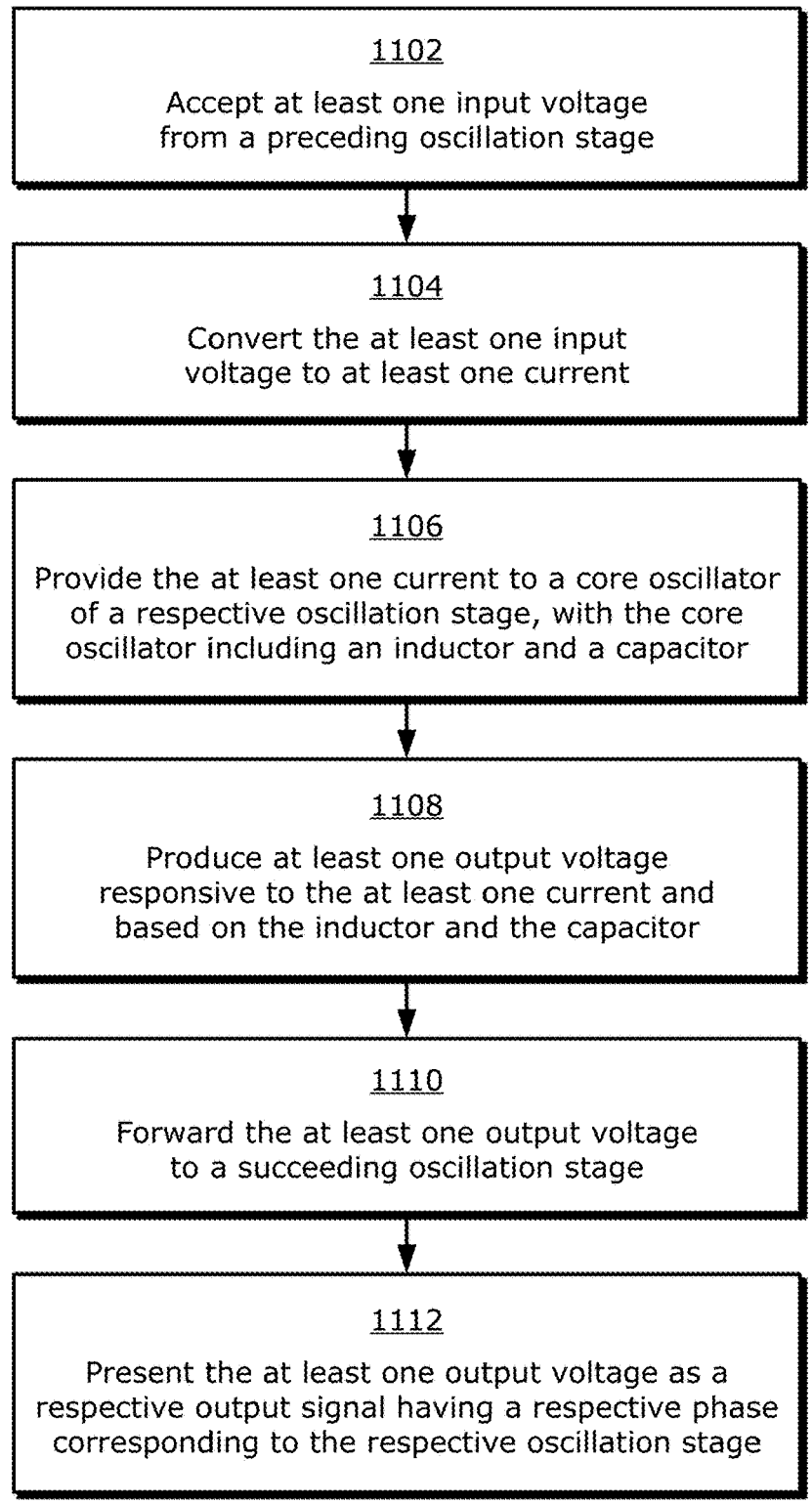
FIG. 11 is a flow diagram illustrating an example process for oscillation signal production.

FIG. 11 is a flow diagram illustrating an example process 1100 for oscillation signal production. The process 1100 is described in the form of a set of blocks 1102-1112 that specify operations that can be performed. However, operations are not necessarily limited to the order shown in FIG. 11 or described herein, for the operations may be implemented in alternative orders or in fully or partially overlapping manners. Also, fewer, more, and/or different operations may be implemented to perform the process 1100, or an alternative process. Operations represented by the illustrated blocks of the process 1100 may be performed by an oscillator 302 or a portion thereof, such as an oscillation stage 304. More specifically, the operations of the process 1100 may be performed by at least one transconductance amplifier 310 and at least one core oscillator 312 of a given oscillation stage 304.

At block 1102, at least one input voltage is accepted from a preceding oscillation stage. For example, a first oscillation stage 304-1 can accept at least one input voltage (e.g., a first voltage V1) from a preceding, or fourth, oscillation stage 304-4. Thus, a transconductance amplifier 310 of the first oscillation stage 304-1 may accept a fourth output signal 316-4 from the fourth oscillation stage 304-4 via at least one input node 406. As used herein, the term "preceding" does not signify any particular position within a ring structure. The term "preceding" may instead indicate a stage that provides an input to another stage.

At block 1104, the at least one input voltage is converted to at least one current. For example, the transconductance amplifier 310 of the first oscillation stage 304-1 can convert the at least one input voltage V1 (e.g., a first plus voltage V1p or a first minus voltage V1m) to at least one current (e.g., an amplifier current Ia). For instance, a plus transistor 506p may convert a signal represented by the first plus voltage V1p into another signal represented by a first amplifier current I1a that flows through a channel of the plus transistor 506p responsive to the first plus voltage V1p.

At block 1106, the at least one current is provided to a core oscillator of a respective oscillation stage, with the core oscillator including an inductor and a capacitor. For example, the transconductance amplifier 310 of the first oscillation stage 304-1 can provide the at least one current I1 to a core oscillator 312 of the respective oscillation stage (which is the first oscillation stage 304-1, here). The core oscillator 312 can include an inductor 514 and a capacitor 516. An LC tank 522 may include the inductor 514 and the capacitor 516, and the capacitor 516 may comprise a fixed capacitor or an adjustable capacitor (e.g., at least one switched capacitor). A total tank current I2t of the LC tank 522 may be affected by a magnitude of the at least one current I1, such as a size of the first amplifier current I1a.

At block 1108, at least one output voltage is produced responsive to the at least one current and based on the inductor and the capacitor. For example, at least one transistor 508 (e.g., a minus transistor 508m) can produce at least one output voltage (e.g., a second voltage V2) responsive to the at least one current I1 and based on the inductor 514 and the capacitor 516. A second minus voltage V2m, for instance, may fluctuate in accordance with oscillations caused at least partially by the LC tank 522 and the first amplifier current I1a.

At block 1110, the at least one output voltage is forwarded to a succeeding oscillation stage. For example, the first oscillation stage 304-1 can forward the at least one output voltage V2 to a succeeding oscillation stage, such as the second oscillation stage 304-2. To do so, the core oscillator 312 may provide the output voltage V2 on the at least one output node 408 as a first output signal 316-1 that is to be propagated at least partially around a ring 318. In some embodiments, the succeeding stage is the same as the preceding stage, for example when two oscillation stages are implemented.

At block 1112, the at least one output voltage is presented as a respective output signal having a respective phase corresponding to the respective oscillation stage. For example, the first oscillation stage 304-1 can provide the at least one output voltage V2 (e.g., a second plus voltage V2p and a second minus voltage V2m) as the respective first output signal 316-1 having a respective first phase 320-1 corresponding to the respective oscillation stage, which is the first oscillation stage 304-1 in this example.

In other implementations, a ring 318 of an oscillator 302 includes a preceding oscillation stage (e.g., a first oscillation stage 304-1), a respective oscillation stage (e.g., a second oscillation stage 304-2), and a succeeding oscillation stage (e.g., a third oscillation stage 304-3). Accordingly, a process may include propagating multiple voltages around the ring 318 based on at least one output voltage from the respective oscillation stage (e.g., a voltage V3 on at least one output node 408 of the second oscillation stage 304-2). The propagating may therefore include presenting a preceding output signal (e.g., a first output signal 316-1) having a preceding phase (e.g., a first phase 320-1) corresponding to the preceding oscillation stage (e.g., the first oscillation stage 304-1) and presenting a succeeding output signal (e.g., a third output signal 316-3) having a succeeding phase (e.g., a third phase 320-3) corresponding to the succeeding oscillation stage (e.g., the third oscillation stage 304-3), as well as presenting a respective output signal (e.g., a second output signal 316-2) having a respective phase (e.g., a second phase 320-2) corresponding to the respective oscillation stage (e.g., the second oscillation stage 304-2).

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus for radio-frequency (RF) oscillation signal production, the apparatus comprising:
an oscillator including multiple oscillation stages coupled together in series into a ring, a respective oscillation stage of the multiple oscillation stages including:
a transconductance amplifier coupled to a preceding oscillation stage, the transconductance amplifier comprising a first differential circuit, the first differential circuit comprising
a plus transistor having a gate terminal, a source terminal, and a drain terminal;
a minus transistor having a gate terminal, a source terminal, and a drain terminal; and
a capacitor coupled between the gate terminal of the plus transistor and the drain terminal of the minus transistor; and
a core oscillator coupled to the transconductance amplifier and to a succeeding oscillation stage, the core oscillator including at least one output node configured to provide a respective output signal,
wherein the succeeding oscillation stage is not the preceding oscillation stage.

2. The apparatus of claim 1, wherein:
the transconductance amplifier includes at least one input node; and
the capacitor is coupled between the at least one input node and the at least one output node.

3. The apparatus of claim 1, wherein:
the transconductance amplifier includes at least one input node;
the plus transistor comprises a field effect transistor (FET) coupled between the at least one input node and the at least one output node; and
the gate terminal of the FET is coupled to the at least one input node and the drain terminal is coupled to the at least one output node, and the FET further includes a back-gate terminal.

4. The apparatus of claim 3, wherein a threshold voltage of the FET is adjustable in response to changes to a back-gate bias voltage applied to the back-gate terminal.

5. The apparatus of claim 1, wherein the multiple oscillation stages are configured to produce multiple respective output signals having a respective phase of multiple respective phases.

6. The apparatus of claim 1, further comprising:
multiple buffers, each buffer of the multiple buffers respectively coupled to an oscillation stage of the multiple oscillation stages; and
multiple vector modulators, each vector modulator of the multiple vector modulators coupled to at least one buffer of the multiple buffers.

7. The apparatus of claim 1, wherein:
the core oscillator comprises a second differential circuit.

8. The apparatus of claim 7, wherein
the source terminal of the minus transistor is coupled to the source terminal of the plus transistor.

9. The apparatus of claim 8, wherein the first differential circuit comprises:
a second capacitor coupled between the gate terminal of the minus transistor and the drain terminal of the plus transistor.

10. The apparatus of claim 9, wherein:
the transconductance amplifier includes a plus input node and a minus input node;
the at least one output node of the core oscillator comprises a plus output node and a minus output node;
the gate terminal of the plus transistor is coupled to the plus input node, and the drain terminal of the plus transistor is coupled to the minus output node; and
the gate terminal of the minus transistor is coupled to the minus input node, and the drain terminal of the minus transistor is coupled to the plus output node.

11. The apparatus of claim 7, further comprising:
a plus input node; and
a minus input node, wherein:
at least a portion of the first differential circuit is implemented with silicon-on-insulator (SOI) semiconductor process technology;
the gate terminal of the plus transistor is coupled to the plus input node; and
the gate terminal of the minus transistor is coupled to the minus input node, and the source terminal of the minus transistor coupled to the source terminal of the plus transistor.

12. The apparatus of claim 11, further comprising a controller configured to adjust a threshold voltage of at least the plus transistor to tune an oscillation frequency of the respective oscillation stage using a back-gate bias voltage applied to a back-gate terminal of the plus transistor.

13. The apparatus of claim 7, wherein the second differential circuit comprises:
a second plus transistor;
a second minus transistor cross-coupled with the second plus transistor; and
an inductive-capacitive tank (LC tank) coupled between the second plus transistor and the second minus transistor.

14. The apparatus of claim 7, wherein:
the second differential circuit comprises:
a second plus transistor including a source terminal and a drain terminal, the drain terminal of the second plus transistor coupled to the drain terminal of the minus transistor; and
a second minus transistor including a source terminal and a drain terminal, the drain terminal of the second minus transistor coupled to the drain terminal of the plus transistor.

15. The apparatus of claim 14, wherein:
the at least one output node comprises a plus output node and a minus output node;
the drain terminal of the second plus transistor corresponds to the plus output node; and
the drain terminal of the second minus transistor corresponds to the minus output node.

16. The apparatus of claim 1, further comprising:
a wireless interface having a transceiver that includes a local oscillator,
wherein the local oscillator includes the oscillator.

17. A system for oscillation signal production, the system comprising:
an oscillator including multiple oscillation stages coupled together in series into a ring, each oscillation stage of the multiple oscillation stages including:
a core oscillator coupled to a succeeding oscillation stage of the multiple oscillation stages, the core oscillator including a plurality of output nodes configured to provide respective output signals of the oscillator with respective phases at an oscillation frequency; and coupling means for coupling the core oscillator to a preceding oscillation stage of the multiple oscillation stages, the coupling means comprising a plurality of means for converting voltage from the preceding oscillation stage to current for the core oscillator, wherein the coupling means comprises a plurality of capacitive coupling means for stabilizing the oscillation frequency of the respective output signals,
wherein the plurality of capacitive coupling means for each oscillation stage are separate from the plurality of capacitive coupling means for each other oscillation stage in the multiple oscillation stages.

18. The system of claim 17, wherein the oscillation frequency comprises a radio frequency (RF).

19. The system of claim 17, wherein a first capacitive coupling means of the plurality of capacitive coupling means is coupled in a first path between an input of a first means of the plurality of means for converting and an output of a second means of the plurality of means for converting, a second capacitive coupling means of the plurality of capacitive coupling means is coupled in a second path between an input of the second means and an output of the first means, and neither the first path nor the second path pass through another of the multiple oscillation stages.

20. The system of claim 17, wherein the coupling means comprises bias means for tuning the oscillation frequency of the respective output signals.

21. A method for radio-frequency (RF) oscillation signal production, the method comprising:
accepting at least one input voltage from a preceding oscillation stage;
converting the at least one input voltage to at least one current;
providing the at least one current to a core oscillator of a respective oscillation stage, the core oscillator including an inductor and a capacitor;
strengthening a first mode of oscillation in comparison to a second mode of oscillation by adding current to a current associated with the inductor and capacitor;
producing at least one output voltage responsive to the at least one current and based on the inductor and the capacitor pursuant to the first mode;
forwarding the at least one output voltage to a succeeding oscillation stage; and
presenting the at least one output voltage as a respective output signal having a respective phase corresponding to the respective oscillation stage,
wherein the succeeding oscillation stage is not the preceding oscillation stage.

22. The method of claim 21, wherein:
a ring of an oscillator includes the preceding oscillation stage, the respective oscillation stage, and the succeeding oscillation stage; and
the method further comprises propagating multiple voltages around the ring based on the at least one output voltage, including:
presenting a preceding output signal having a preceding phase corresponding to the preceding oscillation stage; and
presenting a succeeding output signal having a succeeding phase corresponding to the succeeding oscillation stage.

23. The method of claim 21, wherein the added current comprises an inter-stage coupling current, and wherein the method further comprises:
injecting the inter-stage coupling current into the core oscillator,
wherein the producing comprises producing the at least one output voltage responsive to the at least one current and the inter-stage coupling current and based on the inductor and the capacitor.

24. The method of claim 23, wherein the injecting comprises capacitively coupling current from the preceding oscillation stage to the core oscillator of the respective oscillation stage.

25. The method of claim 21, wherein the converting comprises applying a back-gate bias voltage to a back-gate terminal of at least one transistor of the respective oscillation stage.

26. The method of claim 25, further comprising:
changing the back-gate bias voltage applied to the back-gate terminal of the at least one transistor; and
responsive to the changing, adjusting an oscillation frequency of the at least one output voltage to produce an adjusted oscillation frequency,
wherein the presenting comprises presenting the at least one output voltage at the adjusted oscillation frequency as the respective output signal.

27. An apparatus for radio-frequency (RF) oscillation signal production, the apparatus comprising:
an oscillator including multiple oscillation stages coupled together in series into a ring, a respective oscillation stage of the multiple oscillation stages including:
a plus input node;
a minus input node;
a plus output node;
a minus output node;
a first plus transistor including a gate terminal, a source terminal, and a drain terminal, the gate terminal coupled to the plus input node, and the drain terminal coupled to the minus output node;
a first minus transistor including a gate terminal, a source terminal, and a drain terminal, the gate terminal coupled to the minus input node, and the drain terminal coupled to the plus output node;
a first capacitor directly connected between the gate terminal of the first plus transistor and the drain terminal of the first minus transistor;
a second capacitor directly connected between the gate terminal of the first minus transistor and the drain terminal of the first plus transistor;
a second plus transistor including a gate terminal, a source terminal, and a drain terminal, the gate terminal coupled to the minus output node, and the drain terminal coupled to the plus output node; and
a second minus transistor including a gate terminal, a source terminal, and a drain terminal, the gate terminal coupled to the plus output node, and the drain terminal coupled to the minus output node.

28. The apparatus of claim 27, wherein:
the first capacitor is coupled between the plus input node and the plus output node; and
the second capacitor is coupled between the minus input node and the minus output node.

29. The apparatus of claim 27, wherein:
the first plus transistor includes at least one back-gate terminal; and
the first minus transistor includes the at least one back-gate terminal.

30. The apparatus of claim 28, further comprising:
a voltage supply; and
an inductive-capacitive tank coupled between the plus output node and the minus output node and to the voltage supply, wherein:
the first plus transistor comprises a silicon-on-insulator metal-oxide-semiconductor (SOI MOS) device and includes at least one back-gate terminal;
the first minus transistor comprises another SOI MOS device and includes the at least one back-gate terminal;
the source terminal of the first plus transistor is coupled to the source terminal of the first minus transistor; and
the source terminal of the second plus transistor is coupled to the source terminal of the second minus transistor.

* * * * *